(12) United States Patent
Tsuchiya et al.

(10) Patent No.: US 11,699,645 B2
(45) Date of Patent: Jul. 11, 2023

(54) SEMICONDUCTOR DEVICE HAVING WIRING SUBSTRATE WITH LEAD-OUT WIRINGS

(71) Applicant: RENESAS ELECTRONICS CORPORATION, Tokyo (JP)

(72) Inventors: Keita Tsuchiya, Tokyo (JP); Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 44 days.

(21) Appl. No.: 17/529,972

(22) Filed: Nov. 18, 2021

(65) Prior Publication Data

US 2023/0154839 A1 May 18, 2023

(51) Int. Cl.
*H01L 23/498* (2006.01)
*H01L 23/00* (2006.01)

(52) U.S. Cl.
CPC ........ *H01L 23/49838* (2013.01); *H01L 24/13* (2013.01); *H01L 24/14* (2013.01); *H01L 24/16* (2013.01); *H01L 2224/13147* (2013.01); *H01L 2224/13155* (2013.01); *H01L 2224/14133* (2013.01); *H01L 2224/16227* (2013.01)

(58) Field of Classification Search
CPC ... H01L 23/49838; H01L 24/13; H01L 24/14; H01L 24/16
See application file for complete search history.

(56) References Cited

U.S. PATENT DOCUMENTS

| 10,163,791 | B2 | 12/2018 | Akiba et al. | |
| 11,049,806 | B2 | 6/2021 | Nakagawa et al. | |
| 2013/0077275 | A1* | 3/2013 | Kariyazaki | H05K 1/111 |
| | | | | 174/250 |
| 2018/0082938 | A1* | 3/2018 | Chan | H05K 1/114 |
| 2019/0363050 | A1* | 11/2019 | Kariyazaki | H04L 25/0298 |
| 2020/0168540 | A1* | 5/2020 | Okayasu | H01L 24/16 |

FOREIGN PATENT DOCUMENTS

| JP | 2018-093107 A | 6/2018 |
| JP | 2019-186479 A | 10/2019 |

* cited by examiner

*Primary Examiner* — Michael Jung
(74) *Attorney, Agent, or Firm* — McDermott Will & Emery LLP

(57) ABSTRACT

A semiconductor device includes a wiring substrate having: a first wiring layer having pads; and a second wiring layer having wirings and via-lands. The via-lands include: first-row via-lands connected to first-row pads of the pads, respectively; and second-row via-lands connected to the second-row pads of the pads, respectively. In the perspective plan view, the first-row via-lands have: first via-lands arranged such that a center of each of the first via-lands is shifted in a direction away from a first side of the semiconductor chip than a position overlapping with a center of the corresponding first-row pad; and second via-lands arranged such that a center of each of the second via-lands arranged at a position closer to the first side than the first via-land. In the perspective plan view, the first and second via-lands are alternately arranged in a first direction along the first side.

12 Claims, 13 Drawing Sheets

SEMICONDUCTOR DEVICE HAVING WIRING SUBSTRATE WITH LEAD-OUT WIRINGS

BACKGROUND

The present invention relates to a semiconductor device, for example, a technique applicable to a semiconductor device including a wiring substrate on which a plurality of terminals is arranged on a mounting surface side of a semiconductor chip.

Japanese patent application laid-open No. 2018-093107 discloses a technique of arranging a lead-out wiring(s) on a plurality of wiring layers. Japanese patent application laid-open No. 2019-186479 discloses a semiconductor device in which a plurality of wirings is arranged at a position overlapping with a land connecting an electrode of a semiconductor chip.

SUMMARY

The inventor(s) of the present application is developing a technique for improving performance of the semiconductor device. As part of the technical development, the inventor approaches technical development for making, higher in density, a transmission path of: a signal inputted in the semiconductor chip that is mounted on the wiring substrate; or a signal outputted from the semiconductor chip. For example, in a semiconductor device of a type in which the semiconductor chip is mounted on the wiring substrate by a flip-flop chip, an increase in the number of electrode terminals in the semiconductor chip and an increase in arrangement density are promoted. To comply with its request, the wiring substrate requires a technique for arranging a number of lead-out wirings with high density. Only handling by refinement of a wiring pattern(s) bring limitations on the compliance with the above-mentioned request. Therefore, desired is a technical development for realizing the high-density wiring through a devisal of a wiring layout.

Other problems and novel features will be apparent from the description of the present specification and the accompanied drawings.

A semiconductor device according to one embodiment has a semiconductor chip including a first surface and a plurality of electrode terminals arranged on the first surface; and a wiring substrate on which the semiconductor chip is mounted. The wiring substrate has: a first wiring layer having a plurality of pads, respectively; a second wiring layer having a plurality of wirings electrically connected to the plurality of pads, respectively, and a plurality of via-lands connected to the plurality of wirings, respectively; and a plurality of via-wirings electrically connecting the plurality of pads on the first wiring layer with the plurality of via-lands on the second wiring layer, respectively. In a perspective plan view seeing the wiring substrate from the semiconductor chip, each of the first wiring layer and the second wiring layer on the wiring substrate includes a region overlapping with the semiconductor chip, and a second region not overlapping with the semiconductor chip. Each of the plurality of pads is arranged in the first region of the first wiring layer. Each of the plurality of wirings is arranged in each of the first region on the second wiring layer and the second region on the second wiring layer such that each of the plurality of wirings straddles a first side of the semiconductor chip in the perspective plan view. The plurality of pads includes: a plurality of first-row pads arranged along the first side of the semiconductor chip in the perspective plan view and arranged at a position closest to the first side; and a plurality of second-row pads arranged along the first side of the semiconductor chip in the perspective plan view and arranged at a position second closest to the first side and next to the plurality of first-row pads. The plurality of first via-lands includes a plurality of first-row via-lands connected to the plurality of first-row pads, respectively; and a plurality of second-row via-lands connected to the plurality of second-row pads, respectively. The plurality of first-row via-lands have: a plurality of first via-lands arranged such that their centers are shifted in a direction away from the first side of the semiconductor chip from a position overlapping with a center of the corresponding first-row pad in the perspective plan view; and a plurality of second via-lands arranged such that their centers are at a position closer to the first side of the semiconductor chip than the first via-land in the perspective plan view. In the perspective plan view, the plurality of first via-lands and the plurality of second via-lands are alternately arranged in a first direction along the first side of the semiconductor chip.

DETAILED DESCRIPTION

Figure 1:
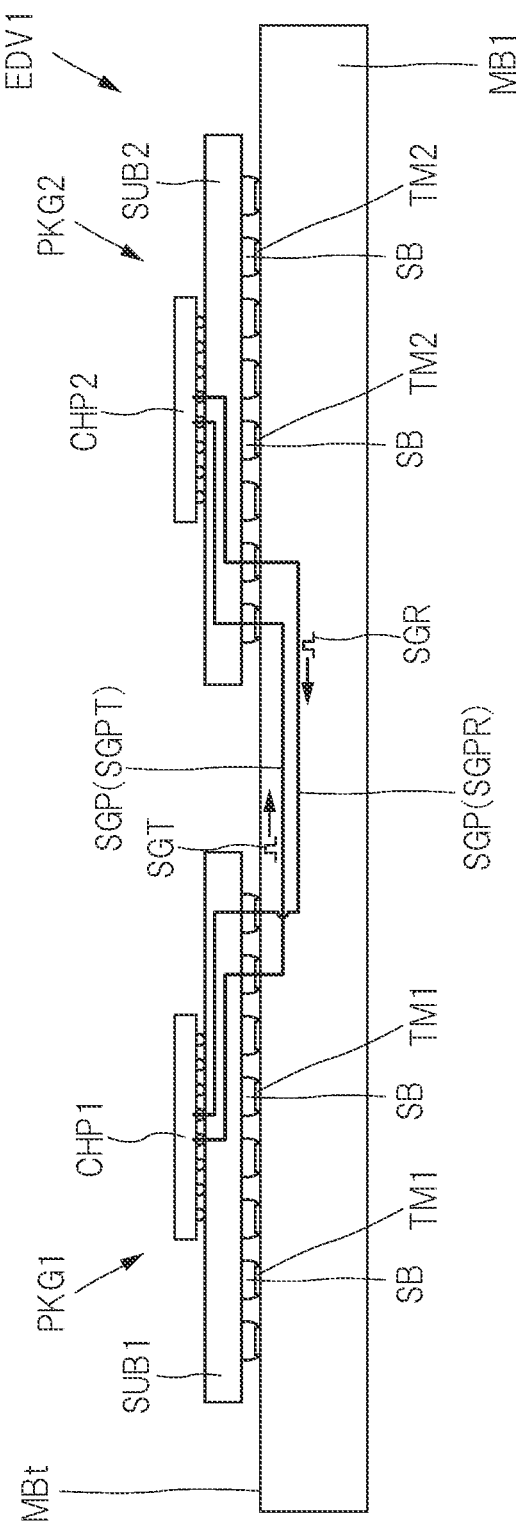
FIG. 1 is an explanatory diagram showing a configuration example of an electronic device according to an embodiment.

Descriptive Forms, Basic Wordings, Explanation of Laws in Present Application

In the present application, the description of the embodiment is described by dividing it into a plurality of sections or the like for convenience, but these are not independent of each other except a case where they are otherwise specified particularly, and these are respective portions of a single example or one of them is a partially detailed description of the other or is a part of or an entirety of a modification example or the like regardless of the pre-description or post-description. Further, a repetitive description of the same part or parts will be omitted in principle. Furthermore, each component in the embodiment is not essential except a case where it is otherwise specified particularly or except cases where the number is theoretically limited and the context is clearly specified otherwise.

Similarly, in the description of the embodiment etc., regarding the material and composition, etc., even when mentioning that constituent elements or the like are "made of A" or "made up of A" in the embodiments below, elements other than A are of course not excluded except the case where it is particularly specified that A is the only element thereof. For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise indicated clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context. Moreover, in the below-mentioned description, a value and another value may be "same" or be described as "identical", but the respective meanings of the wordings "same" and "identical" contain not only a case of being definitely the same but also a case of having an error(s) within a range of being regarded as substantially equal.

Moreover, in each drawing of the embodiments, the same or similar parts is denoted by the same or similar symbols or reference numerals, and its explanation will not be repeated in principle.

Further, in the accompanied drawings, if the drawings become complicated by illustrating the hatchings or cannot clearly discriminate the hatchings from gaps or clearances, the hatchings or the like may be omitted even if the drawings are sectional views. In this regard, even if holes are planarly closed, the outlines of the background may be omitted from the drawings in a case etc. where the holes are clearly understood from their explanatory etc. Moreover, in order to explicitly indicate that they are not gaps or clearances or to explicitly indicate a boundary between regions even if the drawings are not sectional views, the hatchings and dotted patterns are added to the drawings.

<Electronic Device>

Figure 2:
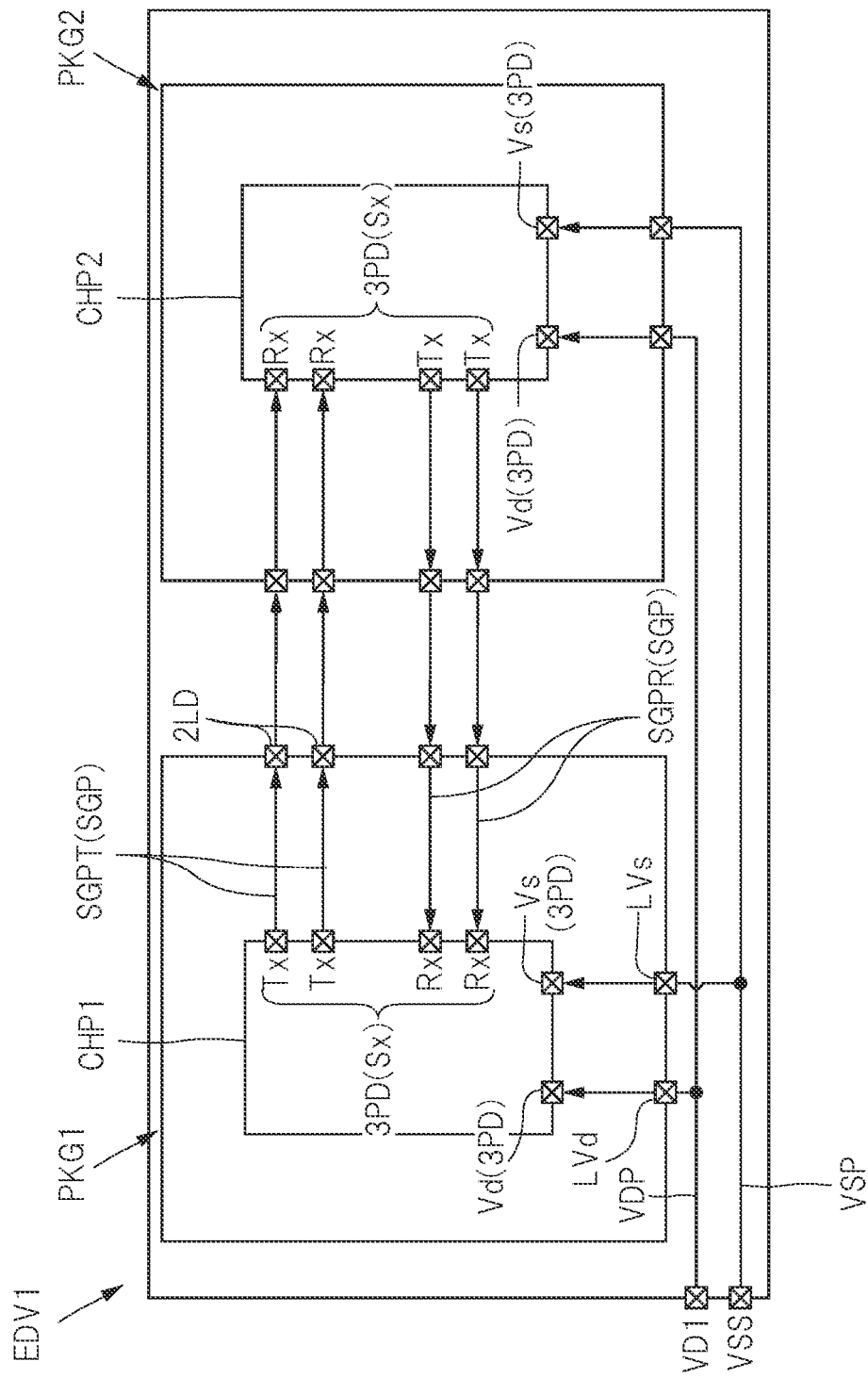
FIG. 2 is an explanatory diagram showing a configuration example of a circuit that the electronic device shown in FIG. 1 has.

First, a usage example of a semiconductor device according to the present embodiment will be described below with reference to FIGS. 1 and 2. FIG. 1 is an explanatory diagram showing a configuration example of an electronic device including a semiconductor device according to the present embodiment. Further, FIG. 2 is an explanatory diagram showing a configuration example of a circuit that the electronic device shown in FIG. 1 has. Incidentally, in FIG. 1, a signal transmission path SGP shown in FIG. 2 is schematically illustrated by thick lines in order to expressly indicate that a semiconductor device PKG1 and a semiconductor device PKG2 are electrically connected to each other.

An electronic device (electronic equipment) EDV1 shown in FIG. 1 includes a wiring substrate (mother board, mounting substrate) MB1, and semiconductor devices PKG1, PKG2 mounted on the wiring substrate MB1. The semiconductor devices PKG1, PKG2 are electrically connected to each other via signal transmission paths SGP that are formed on the wiring substrate MB1. A signal transmitted via the signal transmission paths SGP includes a signal SGT outputted from the semiconductor device PKG1, and a signal SGR inputted to the semiconductor device PKG1. Further, the signal transmission path SGP includes a signal transmission path SGPT transmitting the signal SGT, and a signal transmission path SGPR transmitting the signal SGR.

In an example shown in FIG. 1, the signal SGT is outputted from the semiconductor device PKG1, and is inputted into the semiconductor device PKG2. Further, the signal SGR is outputted from the semiconductor device PKG2, and is inputted to the semiconductor device PKG1. However, an output destination of the signal SGT and an output source of the signal SGR are not limited to the example shown in FIG. 1, and have various modification examples. Since the semiconductor devices PKG1, PKG2 shown in FIG. 1 have the same structure, the semiconductor device PKG1 will be typically described below.

As shown in FIG. 2, the electronic device EDV1 has a plurality of signal transmission paths SGP. The signal transmission path SGP is a high-speed transmission path (high-speed signal transmission path) in which signals are transmitted at a transmission rate of, for example, 5 Gbps (Gigabit per second) or higher. Incidentally, in the present embodiment, described as an example of the signal transmission path SGP which is a high-speed transmission path will be a transmission path having a so-called single-ended structure in which a different signal is transmitted to each of the plurality of signal transmission paths SGP. However, a technique described below can be applied also to a transmission path having a differential system in which one signal is transmitted via a pair of signal transmission paths constituting a differential pair.

As shown in FIG. 2, a semiconductor chip (semiconductor component, electronic component) CHP1, which the semiconductor device PKG1 has, includes a plurality of electrodes (electrode terminals). The plurality of electrodes, which the semiconductor chip CHP1 has, include signal electrodes (signal electrode terminals) Tx through which a signal SGT (see FIG. 1) serving as an output signal (transmission signal) is transmitted. Further, the plurality of electrodes, which the semiconductor chip CHP1 has, include signal electrodes (signal electrode terminals) Rx through which a signal SGR (see FIG. 1) serving as an input signal (received signal) is transmitted. Incidentally, hereinafter, the signal electrode Tx or signal electrode Rx may be collectively referred to as a signal electrode Sx.

FIG. 2 typically shows two output signal transmission paths SGPT and two input signal transmission paths SGPR among the plurality of signal transmission paths SGP that the semiconductor device PKG1 has. However, the number of signal transmission paths SGP, which the semiconductor device PKG1 has, is larger than the number of those shown in FIG. 2.

Further, the plurality of electrodes, which the semiconductor chip CHP1 has, include electrodes (reference potential electrode, first potential electrode) Vs supplying a reference potential (first potential) VSS and electrodes (power supply potential electrode, second potential electrode) Vd supplying a power supply potential (second voltage) VDD. The power supply potential VDD is supplied via the electrode Vd to the semiconductor chip CHP1 (specifically, circuit that the semiconductor chip CHP1 has). Furthermore, the reference potential VSS is supplied via the electrodes Vs to the semiconductor chip CHP1 (specifically, circuit that the semiconductor chip CHP1 has). At least some of the plurality of circuits, which the semiconductor chip CHP1 has, are driven by a drive voltage generated by a potential difference between the power supply potential VDD and the reference potential VSS. The reference potential VSS is, for example, a ground potential, and the power supply potential VDD is higher than the reference potential VSS.

<Semiconductor Device>

Figure 3:
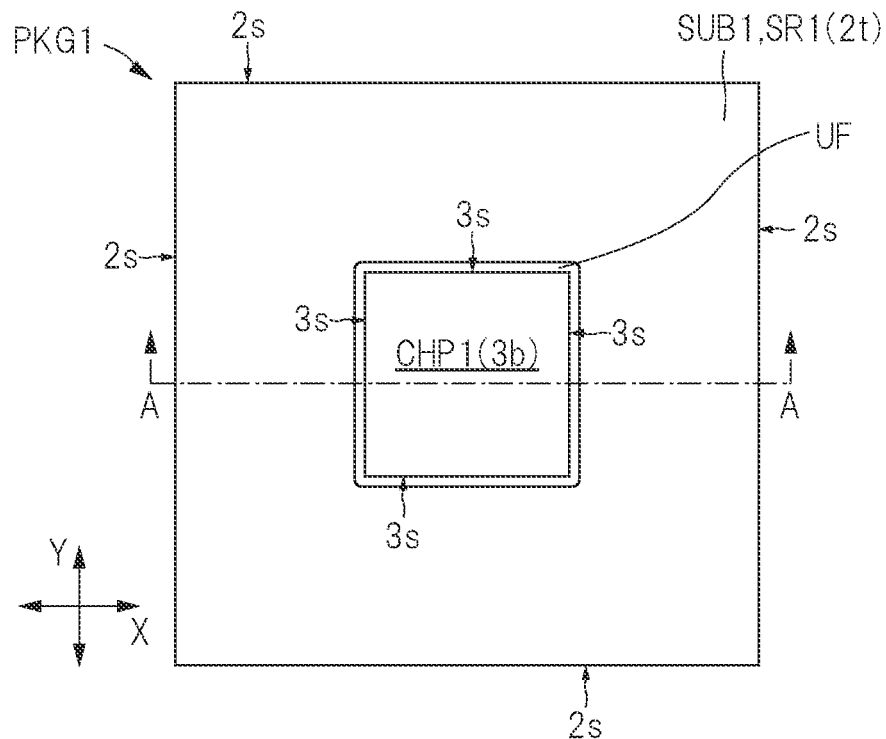
FIG. 3 is a top view of one of two semiconductor devices shown in FIG. 1.
Figure 4:
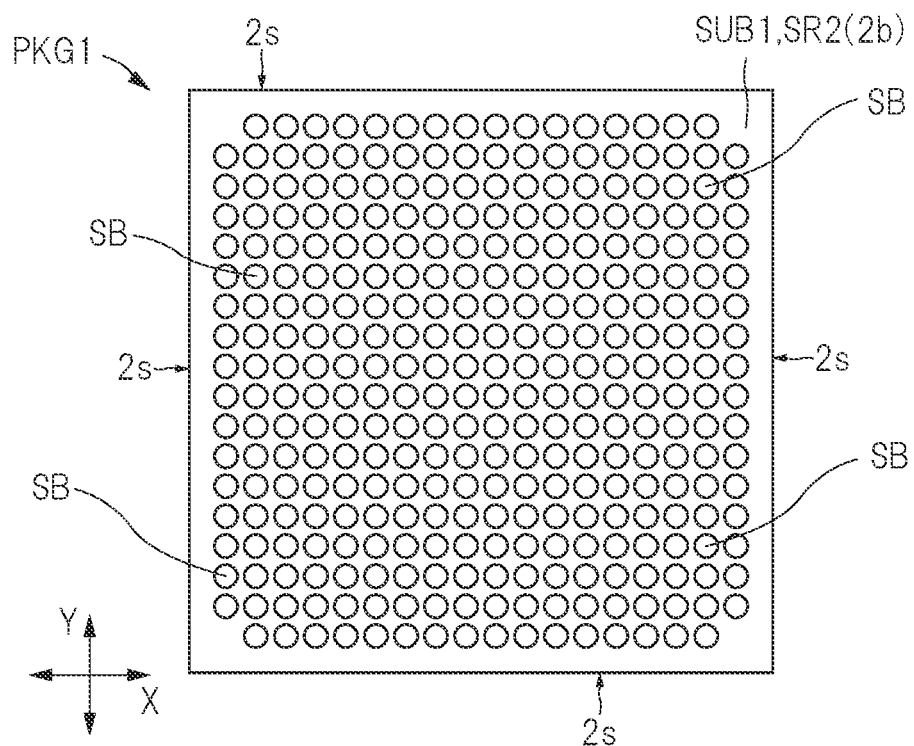
FIG. 4 is a bottom view of the semiconductor device shown in FIG. 3.
Figure 5:
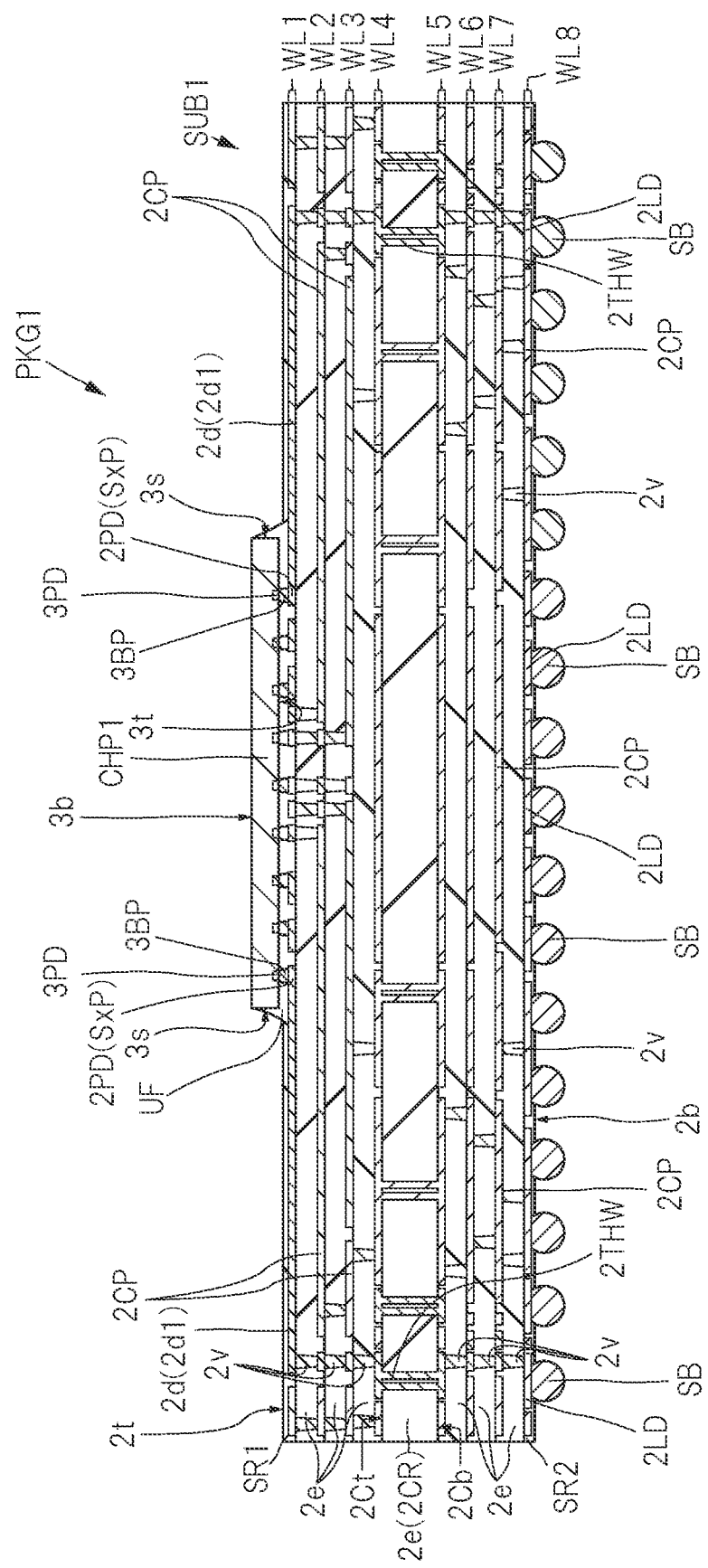
FIG. 5 is a section view taken along line A-A of FIG. 3.
Figure 6:
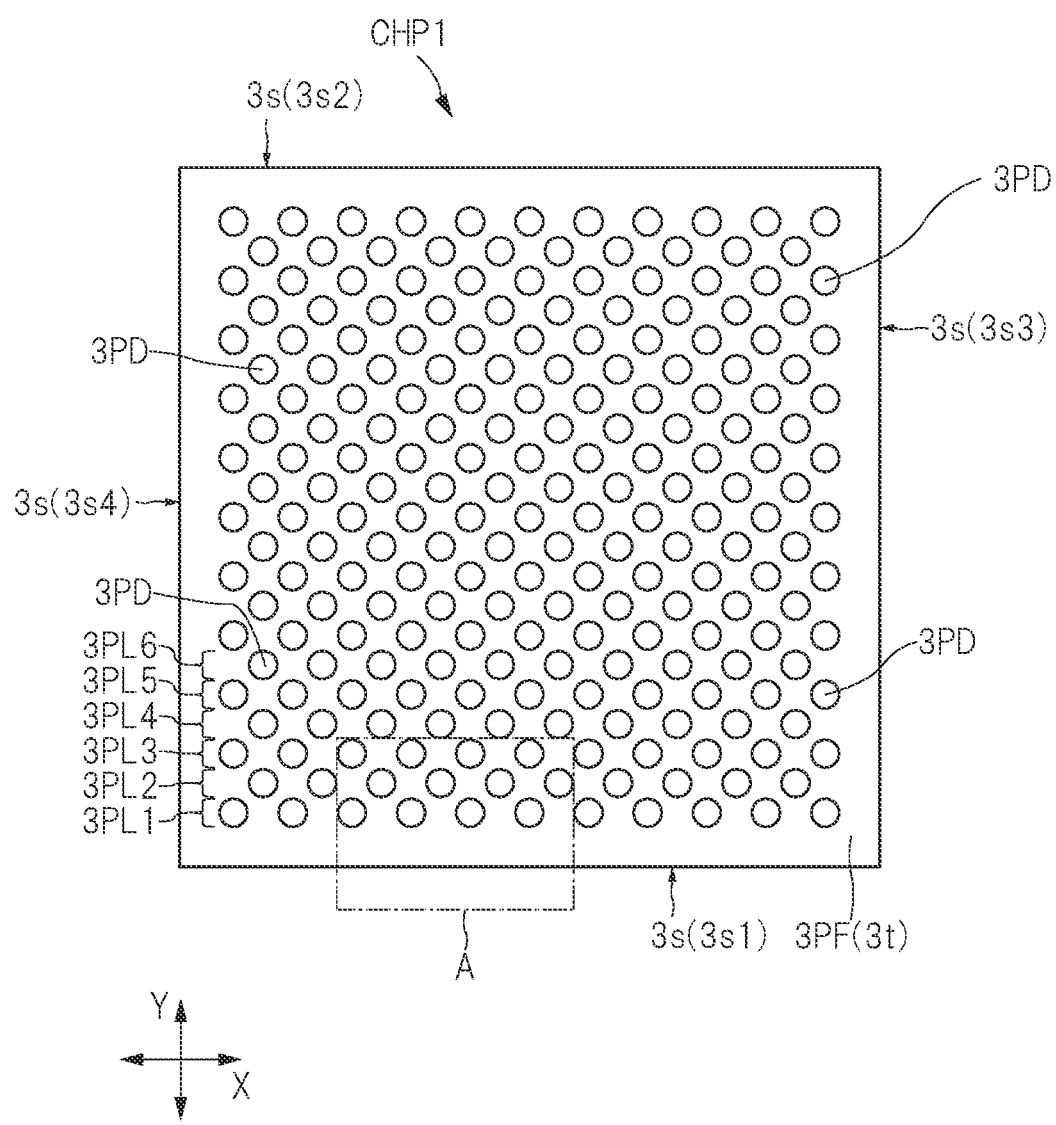
FIG. 6 is a plan view of an electrode arranging face of a semiconductor chip shown in FIG. 5.

Taking the semiconductor device PKG1 shown in FIG. 1 as an example, a structural example of a signal transmission path in the semiconductor device PKG1 will be described. First, an outline of the semiconductor device PKG1 will be described, and then a structure of the signal transmission path will be described. FIG. 3 is a top view of one of the two semiconductor devices shown in FIG. 1. FIG. 4 is a bottom view of the semiconductor device shown in FIG. 3. Further, FIG. 5 is a sectional view taken along line A-A of FIG. 3. Furthermore, FIG. 6 is a plan view of an electrode arranging surface of the semiconductor chip shown in FIG. 5.

The semiconductor device PKG1 of the present embodiment shown in FIG. 3 includes a wiring substrate SUB1 and a semiconductor chip CHP1 mounted on the wiring board SUB1. As shown in FIG. 5, the wiring substrate SUB1 has a top surface (face, main surface, chip mounting surface, first main surface) 2t on which the semiconductor chip CHP1 is mounted, and a bottom surface (face, main surface, mounting surface, second main surface) 2b opposite to the top surface 2t. Further, the wiring substrate SUB1 has a plurality of side surfaces 2s (see FIGS. 3 and 4) that intersect with respective outer peripheries of the top surface 2t and the bottom surface 2b. In a case of the present embodiment, the top surface 2t (see FIG. 3) and the bottom surface 2b (see FIG. 4) of the wiring substrate SUB1 are each quadrangle.

The wiring substrate SUB1 is an interposer (relay substrate) that electrically connects the semiconductor chip CHP1 mounted on the top surface 2t and the wiring substrate MB1 (see FIG. 1) which is a motherboard (mounting substrate). The wiring substrate SUB1 has a plurality of wiring layers (eight layers in an example shown in FIG. 5) WL1, WL2, WL3, WL4, WL5, WL6, WL7, and WL8 for electrically connecting a terminal (pad 2PD) on a top surface 2t side which is the chip mounting surface and a terminal (land 2LD) on a bottom surface 2b side which is the mounting surface. Each wiring layer is between the top surface 2t and the bottom surface 2b. Each wiring layer has a conductor pattern such as a wiring which is a path for supplying an electric signal or electric power. Further, an insulating film 2e is arranged between the wiring layers. The respective wiring layers are electrically connected to each other through via-wirings 2v, which are interlayer conductive paths penetrating the insulating film 2e, or through-hole wirings 2THW.

In addition, a wiring layer WL1, which is arranged on the uppermost surface 2t side among the plurality of wiring layers, is covered with an insulating film (solder resist film) SR1. A plurality of pads 2PD are formed on the wiring layer WL1. Further, a wiring layer WL8, which is provided with a plurality of lands 2LD, is provided on the bottom surface 2b side of the wiring substrate SUB1. The wiring layer WL8 is covered with an insulating film SR2 which is a solder resist film. Each of the plurality of pads 2PD provided on the wiring layer WL1 and the plurality of lands 2LD provided on the wiring layer WL8 are electrically connected through conductor patterns (wiring 2d and conductor pattern 2CP), via-wirings 2v, and through-hole wirings 2THW formed on each wiring layer which the wiring substrate SUB1 has.

Incidentally, in FIG. 5, a plurality of via-wirings 2v, which are connected to the signal pads SxP and electrically connect the respective wiring layers, are laminated in order to demonstrate through one figure that the signal pad SxP is connected to the land 2LD and a solder ball SB via the wiring 2d, the plurality of via-wirings 2v, and the through-hole wiring 2THW. However, each layout of the plurality of via-wirings 2v and the conductor pattern 2CP is not limited to an example shown in FIG. 5, and has various modification examples.

Further, the wiring substrate SUB1 is formed by, for example, laminating each of a plurality of wiring layers with a build-up method on a top surface 2Ct and a bottom surface 2Cb of an insulating layer (core material, core insulating layer) 2CR made of a prepreg in which glass fibers are impregnated with a resin. Furthermore, the wiring layer WL4 on a top surface 2Ct side and the wiring layer WL5 on a bottom surface 2Cb side of the insulating layer 2CR are electrically connected through the plurality of through-hole wiring 2THWs, which are embedded in a plurality of through-holes provided so as to penetrate from one of the top surface 2Ct and the bottom surface 2Cb to the other.

A plurality of pads (terminals, bonding pads, semiconductor chip connecting lands) 2PD electrically connected to the semiconductor chip CHP1 is formed on the wiring layer WL1 on a top surface 2t side of the wiring substrate SUB1. Further, a plurality of lands 2LDs, which are external input/output terminals of the semiconductor device PKG1, are formed on the wiring layer WL8 lying on a bottom surface 2b side of the wiring substrate SUB1. The plurality of pads 2PD and the plurality of lands 2LD are electrically connected to each other through the wiring 2d, the via-wiring 2v, and the through-hole wiring 2THW formed on the wiring substrate SUB1. Details of a connection structure of the pad 2PD and the wiring layer WL2 will be described later.

In an example shown in FIG. 5, the wiring substrate SUB1 shows a wiring substrate in which a plurality of wiring layers is laminated on each of the top surface 2Ct side and the bottom surface 2Cb side of the insulating layer 2CR which is a core material. However, used as a modification example of FIG. 5 may be a so-called coreless substrate which does not have an insulating layer 2CR made of a hard material such as a prepreg material and is formed by laminating an insulating film 2e and a conductor pattern such as a wiring 2d in order. When the coreless substrate is used, the through-hole wiring 2THW is not formed and each wiring layer is electrically connected through the via-wiring 2v. Further, FIG. 5 illustratively shows the wiring substrate SUB1 having eight wiring layers. However, as a modification example, for example, a wiring substrate, which has nine layers or more or seven layers or less, may be used.

Further, in the example shown in FIG. 5, a solder ball (solder material, external terminal, electrode, external electrode) SB is connected to each of the plurality of lands 2LD. When the semiconductor device PKG1 is mounted on the wiring substrate MB1 shown in FIG. 1, the solder ball SB is a conductive member that electrically connects a plurality of terminals (not shown) on the wiring board MB1 side and the plurality of lands 2LD. The solder ball SB is, for example, a Sn—Pb solder material containing lead (Pb) or a solder material made of so-called lead-free solder that does not substantially contain Pb. Examples of lead-free solder include, for example, tin (Sn) only, tin-bismuth (Sn—Bi), tin-copper-silver (Sn—Cu—Ag), tin-copper (Sn—Cu), and the like. Here, the lead-free solder means that a contented amount of lead (Pb) is 0.1 wt % or less, and this contented amount is defined as a standard of a RoHS (Restriction of Hazardous Substances) instruction.

As shown in FIG. 4, a plurality of solder balls SB are arranged in a matrix (array pattern, matrix pattern). Further, although being omitted in FIG. 4, the plurality of lands 2LDs (see FIG. 5) to which the plurality of solder balls SB is joined are also arranged in a matrix. In this way, a semiconductor device, in which a plurality of external terminals (solder balls SB, lands 2LD) is arranged in a matrix on the mounting surface side of the wiring substrate SUB1, is called an area-array type semiconductor device. The area-array type semiconductor device can effectively use the mounting surface (bottom surface 2b) side of the wiring substrate SUB1 as an arranging space of an external terminal(s), thereby making it possible to preferably suppress an increase in a mounting area of the semiconductor device even if the number of external terminals increases. The semiconductor device in which the number of external terminals increases with higher functionality and higher integration can be mounted in a space saving.

The semiconductor device PKG1 has a semiconductor chip CHP1 that is mounted on the wiring substrate SUB1. As shown in FIG. 5, each semiconductor chip CHP1 has a front surface (main surface, top surface) 3t and a back surface (main surface, bottom surface) 3b opposite the front surface. Further, the semiconductor chip CHP1 has a plurality of side surfaces 3s that intersect with the front surface 3t and the back surface 3b. In a plan view as shown in FIG. 3, the semiconductor chip CHP1 has an outer shape of a quadrangular that has a smaller flat area than the wiring substrate SUB1. In an example shown in FIG. 3, the semiconductor chip CHP1 is mounted in a central region of the top surface 2t of the wiring substrate SUB1 (region including a center of the top surface 2t), and each of the four side surfaces 3s of the semiconductor chip CHP1 extends along each of the four side surfaces 2s of the wiring substrate SUB1.

As shown in FIG. 6, the front surface 3t of the semiconductor chip CHP1 includes: a side 3s1; a side 3s2 opposite to the side 3s1; a side 3s3 intersecting with the side 3s1 and the side 3s2; and a side 3s4 opposite to the side 3s3. A plurality of electrodes (pads, electrode terminals) 3PD are arranged on a front surface 3t side of the semiconductor chip CHP1. The plurality of electrodes 3PD are exposed from an insulating film (passivation film, protective insulating film) 3PF that covers most of the front surface 3t of the semiconductor chip CHP1 on the front surface 3t of the semiconductor chip CHP1. The plurality of electrodes 3PD are arranged on the front surface 3t in a plurality of rows from the outermost circumference closest to the outer periphery of the front surface 3t toward a center of the front surface 3t. For example, if it is assumed that the side 3s1 of the semiconductor chip CHP1 is set as a reference, the plurality of electrodes 3PD include: a plurality of first-row electrodes 3PL1 closest to the side 3s1; a plurality of second-row electrodes 3PL2 closest to the side 3s1 and next to the first-row electrodes 3PL1; a plurality of third-row electrodes 3PL3 closest to the side 3s1 and next to the second-row electrodes 3PL2; a plurality of fourth-row electrodes 3PL4 closest to the side 3s1 and next to the third-row electrodes 3PL3; a plurality of fifth-row electrodes 3PL5 closest to the side 3s1 and next to the fourth-row electrodes 3PL4; and a plurality of sixth-row electrodes 3PL6 closest to the side 3s1 and next to the fifth-row electrodes 3PL5.

In the present embodiment, a plurality of electrodes 3PD are arranged in a matrix (matrix pattern or array pattern) on the front surface 3t of the semiconductor chip CHP1. By arranging the plurality of electrodes 3PD of the semiconductor chip CHP1 in a matrix, the front surface 3t of the semiconductor chip CHP1 can be effectively used as an electrode arranging space, so that even if the number of electrodes of the semiconductor chip CHP1 increases, an increase in a flat area can be preferably suppressed. In an example shown in FIG. 6, the plurality of electrodes 3PD are arranged in a houndstooth pattern. That is, each of the plurality of first-row electrodes 3PL1 and the plurality of second-row electrodes 3PL2 is arranged (arrayed) long an X direction which is an extending direction of the side 3s1. In a Y direction orthogonal to the X direction, the plurality of second-row electrodes 3PL2 are not arranged linearly with the plurality of first-row electrodes 3PL1, and are arrayed so as to be shifted between the first-row electrodes 3PL1 adjacent to each other.

Further, in the example shown in FIG. 5, the semiconductor chip CHP1 is mounted on the wiring substrate SUB1 in a state where the front surface 3t opposes the top surface 2t of the wiring substrate SUB1. Such a mounting method is called a face-down mounting method or a flip-chip connecting method.

Although omitted in the figure, a plurality of semiconductor elements (circuit elements) is formed on a main surface (specifically, a semiconductor-element forming region provided on an element forming surface of the semiconductor substrate which is a base material of the semiconductor chip CHP1) of the semiconductor chip CHP1. The plurality of electrodes 3PD is electrically connected to the plurality of semiconductor elements through a wiring (omitted in the figure), respectively, that is formed on a wiring layer arranged in an interior part (specifically, between the front surface 3t and the not-shown semiconductor-element forming region) of the semiconductor chip CHP1.

The semiconductor chip CHP1 (specifically, the base material of the semiconductor chip CHP1) is made of, for example, silicon (Si). Further, an insulating film 3PF (see FIG. 6) that covers the base material and the wiring of the semiconductor chip CHP1 is formed on the front surface 3t, and each part of the plurality of electrodes 3PD is exposed from the insulating film in an opening that is formed in the insulating film 3PF. Further, each of the plurality of electrodes 3PD is made of metal and, in the present embodiment, is made of, for example, aluminum (Al).

As shown in FIG. 5, a protrusion electrode 3BP is connected to each of the plurality of electrodes 3PD, and the plurality of electrodes 3PD of the semiconductor chip CHP1 and the plurality of pads 2PD of the wiring substrate SUB1 are connected to each other via the plurality of protrusion electrodes 3BP. The protrusion electrode (bump electrode) 3BP is a metal member (conductive member) formed so as to project on the front surface 3t of the semiconductor chip CHP1. In the present embodiment, the protrusion electrode 3BP is a so-called solder bump in which a solder material is laminated on the electrode 3PD via an underlying metal film (under bump metal). The underlying metal film can be exemplified as, for example, a laminated film (a gold (Au) film is further formed on a nickel film in some cases) in which titanium (Ti), copper (Cu), and nickel (Ni) are laminated from a connecting surface side with the electrode 3PD. Furthermore, as a solder material constituting the solder bump, a lead-containing solder material or lead-free solder can be used similarly to the above-mentioned solder ball SB. When the semiconductor chip CHP1 is mounted on the wiring substrate SUB1, the solder bumps are formed in advance on both the plurality of electrodes 3PD and the plurality of pads 2PD, and a heat treatment (reflow processing) is performed in a state where the solder bumps contact with each other. By doing so, the solder bumps are integrated with each other to form the protrusion electrode 3BP. In addition, as a modification example of the present embodiment, a pillar bump (columnar electrode) in which a solder film is formed on a tip surface of a conductor column made of copper (Cu) or nickel (Ni) may be used as the protrusion electrode 3BP.

An underfill resin (insulating resin) UF is arranged between the semiconductor chip CHP1 and the wiring substrate SUB1. The underfill resin UF is arranged so as to close a space between the front surface 3t of the semiconductor chip CHP1 and the top surface 2t of the wiring substrate SUB1. Each of the plurality of protrusion electrodes 3BP is sealed with the underfill resin UF. Further, the underfill resin UF is made of an insulating (non-conductive) material (for example, a resin material), and is arranged so as to seal an electrically connecting portion (joint portion of the plurality of protrusion electrodes 3BP) between the semiconductor chip CHP1 and the wiring substrate SUB1. In this way, by covering the joint portion between the plurality of protrusion electrodes 3BP and the plurality of pads 2PD with the underfill resin UF, a stress generated in the electrically connecting portion between the semiconductor chip CHP1 and the wiring substrate SUB1 can be relaxed. Moreover, the stresses generated at joint portions between the plurality of electrodes 3PD of the semiconductor chip CHP1 and the plurality of protrusion electrodes 3BP can also be relaxed. Furthermore, protected can also be the main surface on which the semiconductor element (circuit element) of the semiconductor chip CHP1 is formed.

Incidentally, although omitted in the figure, a heat sink may be attached to the back surface 3b of the semiconductor chip CHP1 as a modification example of the present embodiment.

<Structural Configuration Example Around Pad>

Figure 7:
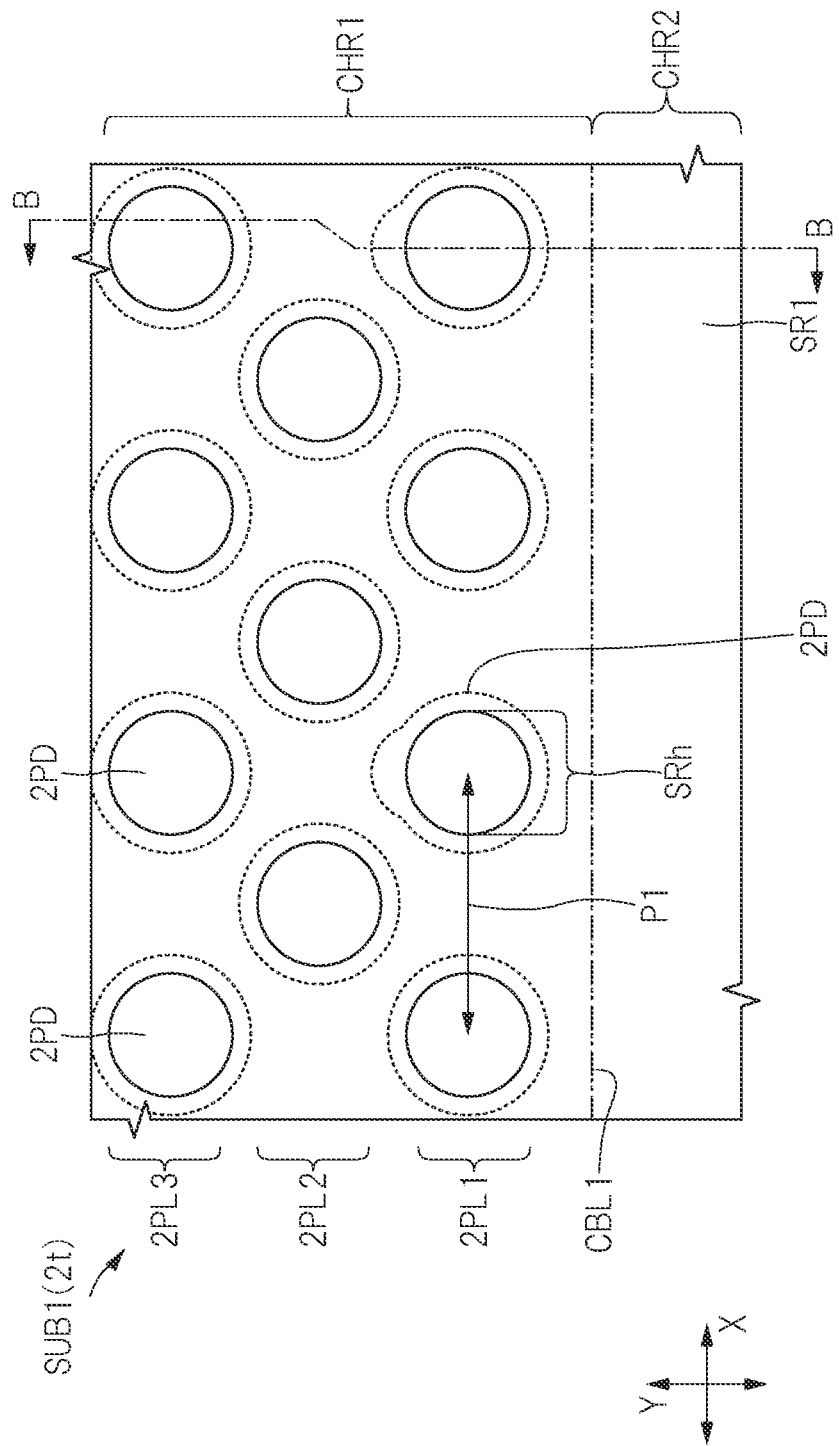
FIG. 7 is an enlarged plan view showing by enlarging, in a top face of a wiring substrate shown in FIG. 5, a periphery around terminals (pads) opposing to a plurality of electrodes that are arranged in an A portion shown in FIG. 6.
Figure 8:
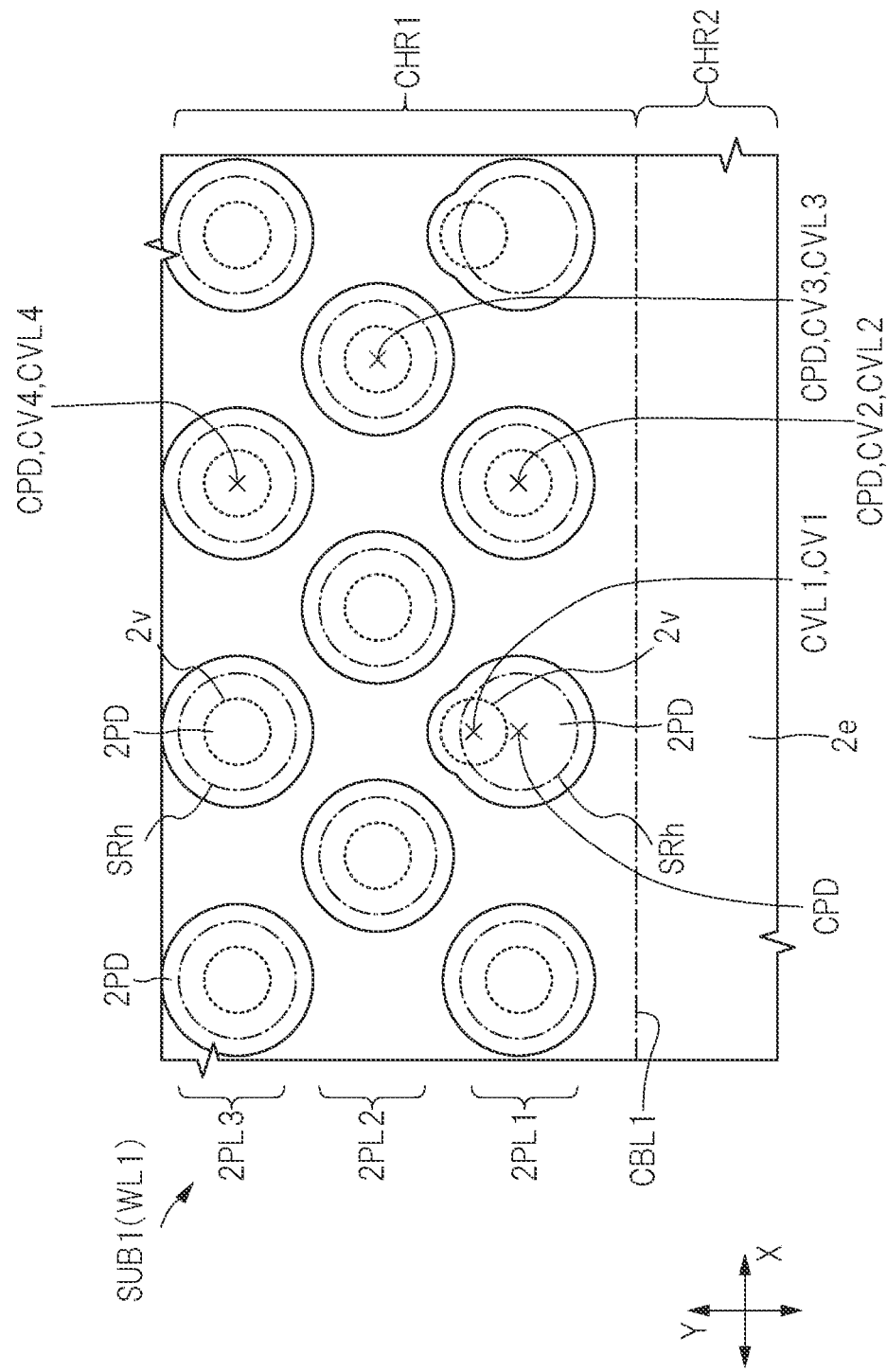
FIG. 8 is an enlarged plan view showing, in the plan view shown in FIG. 7, a state of removing an insulating film that covers a wiring layer.
Figure 9:
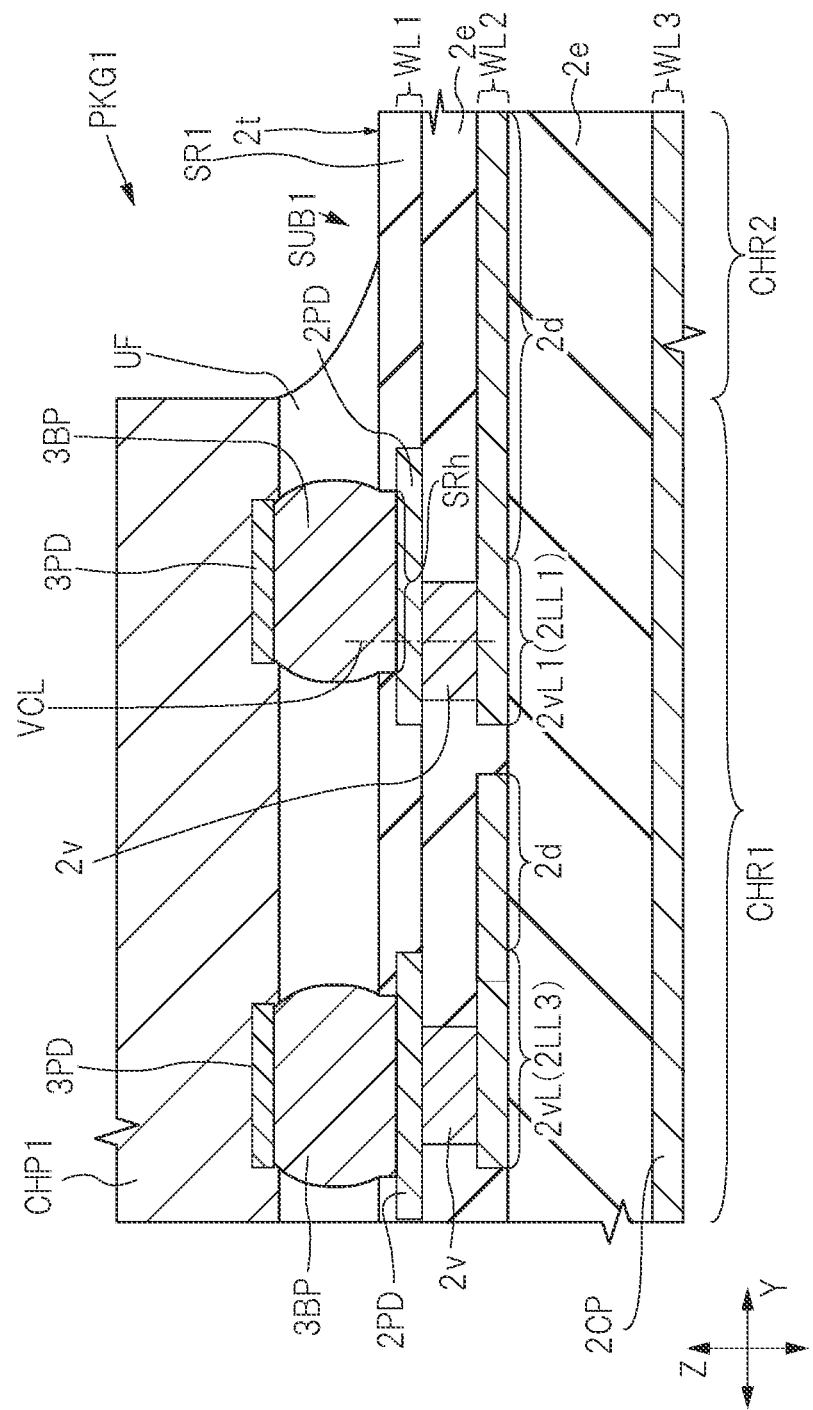
FIG. 9 is an enlarged sectional view taken along line B-B of FIG. 7.
Figure 10:
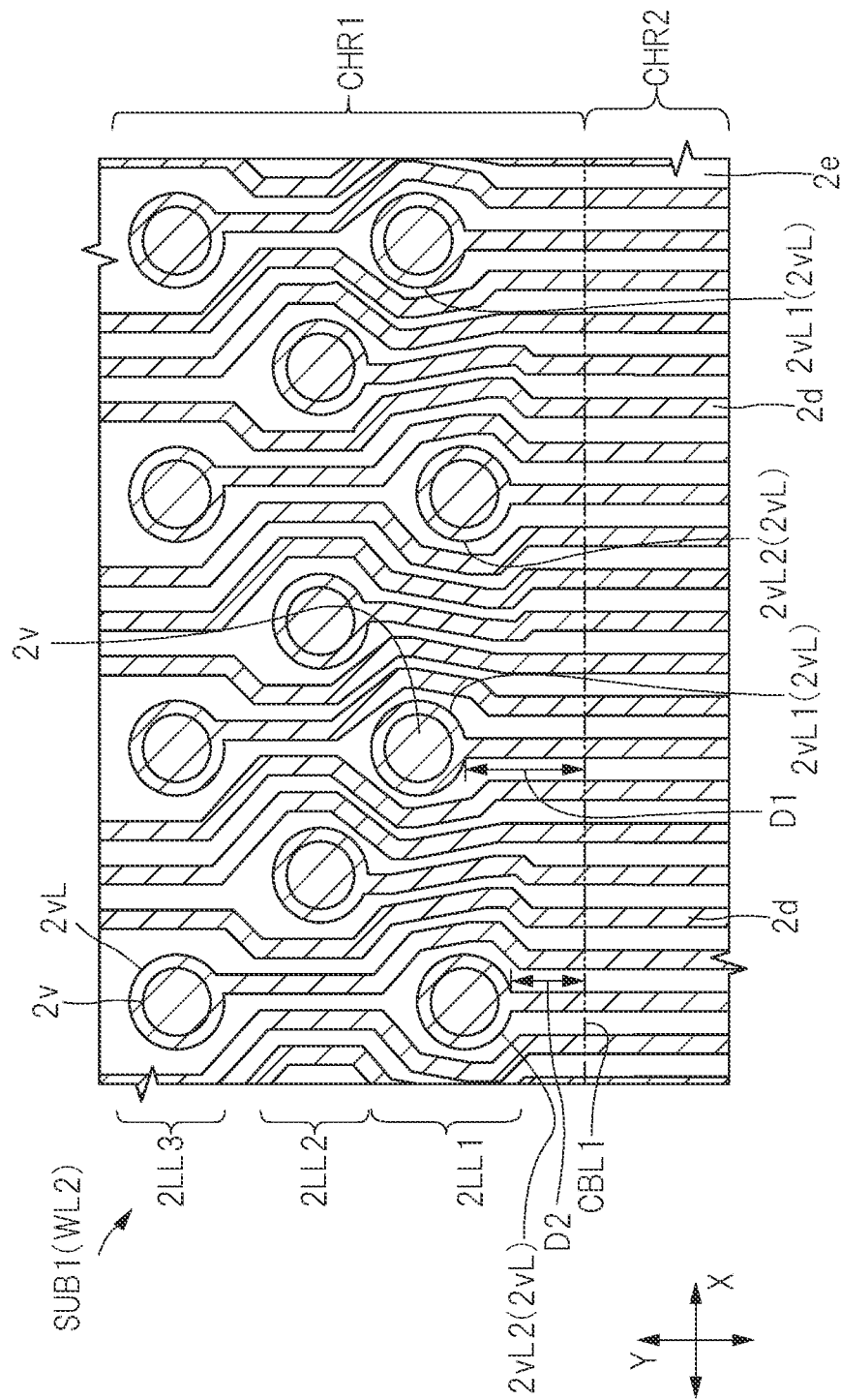
FIG. 10 is an enlarged plan view showing a second wiring layer shown in FIG. 5 and shows a portion overlapping with a portion shown in FIG. 7.

Next, details of a connecting structure between the plurality of pads 2PD, which the semiconductor device PKG1 shown in FIG. 5 has, and the wiring layer WL2 will be described. FIG. 7 is an enlarged plan view showing, on the top surface of the wiring substrate shown in FIG. 5, peripheries of the terminals (pads) opposing the plurality of electrodes arranged in the A portion shown in FIG. 6. Each peripheral portion of the plurality of pads 2PD shown in FIG. 7 is covered with the insulating film SR1. In FIG. 7, an outline of the outer periphery of the pad 2PD is shown by a dotted line. FIG. 8 is an enlarged plan view showing, in a plan shown in FIG. 7, a state in which the insulating film covering the wiring layer is removed. FIG. 8 shows an outline of each via-wiring 2v by a dotted line, and an outline of the opening SRh shown in FIG. 7 by a dash-single-dot line. FIG. 9 is an enlarged sectional view taken along line B-B of FIG. 7. FIG. 10 is an enlarged plan view showing a second wiring layer shown in FIG. 5, and shows a portion overlapping with a portion shown in FIG. 7. In FIG. 10, in order to make it easy to differentiate between a portion in which a conductor pattern is formed and the other portion, hatching is attached to each of a plurality of wirings 2d, a plurality of via-lands 2vL, and a plurality of via-wirings 2v. Each of FIGS. 7, 8 and 10 is a perspective plan view seen from any layer of the plurality of wiring layers, which the wiring substrate SUB1 shown in FIG. 5 has, from a semiconductor chip CHP1 side. Incidentally, each of FIGS. 11, 12, and 14 described later is also a perspective plan view seen from any of the plurality of wiring layers, which the wiring substrate SUB1 shown in FIG. 5 has, from the semiconductor chip CHP1 side. In FIG. 8, marked and illustrated is each position of a center CPD of a first-row pad 2PD, a center CVL1 of the via-land 2vL1 (see FIG. 10), a center CV1 of the via-wiring 2v connected to the via-land 2vL1, a center CVL2 of the via-land 2vL2 (see FIG. 10), and a center CV2 of the via-wiring 2v connected to the via-land 2vL2. Similarly, in FIG. 8, marked and illustrated is each position of a center CPD of a second-row pad 2PD, a center CVL3 of a second-row via-land 2LL2 (see FIG. 10), a center CV3 of the via-wiring 2v connected to the second-row via-land 2LL2, a center CVL4 of a third-row via-land 2LL3 (see FIG. 10), and a center CV4 of the via-wiring 2v connected to the third-row via-land 2LL3.

In a perspective plan view seen from the semiconductor chip CHP1 side, each of the wiring substrate SUB1 shown in FIG. 5 and the plurality of wiring layers includes: a region (first region) CHR1 (see FIG. 7) that overlaps with the semiconductor chip CHP1; and a region that does not overlap with the semiconductor chip CHP1 and is around the region CHR1. Further, each of the plurality of wiring layers includes a boundary line CBL1 (see FIG. 7) that is a boundary between the region CHR1 and the region CHR2 and overlaps with the side 3s1 (see FIG. 6) of the semiconductor chip CHP1 in a perspective plan view. In FIGS. 7, 8 and 10, the boundary line CBL1 between the region CH1 and the region CHR2 is shown by a dash-double-dot line. In the following description, the term "boundary line CBL1" in the text described by using the boundary line CBL1 can be read as the phrase "the side 3s1 of the semiconductor chip CHP1 in a plan view seen from the semiconductor chip CHP1 side".

As shown in FIG. 7, each peripheral portion of the plurality of pads 2PD is covered with the insulating film SR1, and each central portion of the plurality of pads 2PD is exposed from the insulating film SR1 in an opening SRh formed in the insulating film SR1. As shown in FIG. 9, a portion of the pad 2PD exposed from the opening SRh is joined to the protrusion electrode 3BP. The plurality of pads 2PD mutually opposes the plurality of electrodes 3PD shown in FIG. 6. The plurality of pads 2PD, which the wiring substrate SUB1 has, forms a signal transmission path, a reference-potential supply path, or a power-supply-potential supply path.

Further, as shown in FIG. 7, the plurality of pads 2PD is arranged in a plurality of rows on the top surface 2t of the wiring substrate SUB1. For example, if it is assumed that the boundary line CBL1 of the wiring layer WL1 shown in FIG. 8 is set as a reference, the plurality of pads 2PD includes: a plurality of first-row pads 2PL1 closest to the boundary line CBL1; a plurality of second-row pads 2PL2 closest to the boundary line CBL1 and next to the first-row pads 2PL1; a plurality of third-row pads 2PL3 closest to the boundary line CBL1 and next to the second-row pads 2PL2. Incidentally, in the present embodiment, a pitch between the plurality of first-row pads 2PL1, a pitch between the plurality of second-row pads 2PL2, and a pitch between the plurality of third-row pads 2PL3 are at least the same in design. Each of the plurality of pads 2PD shown in FIGS. 7 and 8 includes, for example, the signal transmission path SGP described with reference to FIG. 2. In an example shown in FIG. 7, the plurality of pads 2PD is arranged in a houndstooth pattern. That is, each of the plurality of first-row pads 2PL1 and the plurality of second-row pads 2PL2 are arranged along the X direction which is an extending direction of the boundary line CBL1. In the Y direction orthogonal to the X direction, the plurality of second-row pads 2PL2 is not arranged linearly with the plurality of first-row pads 2PL1, and are arranged so as be shifted between the first-row pads 2PL1 adjacent to each other. In other words, each of the plurality of second-row pads 2PL2 is arranged in the X direction so as to be located between the plurality of first-row pads 2PL1.

Each of the plurality of pads 2PD is connected to the via-land 2vL, which is formed on the wiring layer WL2 shown in FIG. 10, through the via-wiring 2v. The plurality of via-lands 2vL includes: a plurality of first-row via-lands 2LL1 connected to the plurality of first-row pads 2PL1 (see FIG. 7); a plurality of second-row via-lands 2LL2 connected to the plurality of second-row pads 2PL2; and a plurality of third-row via-lands 2LL3 connected to the plurality of third-row pads 2PL3 (see FIG. 7).

Each of the plurality of via-lands 2vL is connected to the wiring 2d. In other words, the plurality of wirings 2d is electrically connected to the plurality of pads 2PD, respectively. Specifically, the plurality of wirings 2d and the plurality of pads 2PD are electrically connected to each other via the plurality of via-wirings 2v. In a case of a semiconductor device having a large number of signal transmission paths like the present embodiment, the wiring 2d (see FIG. 10) connected to each of a large number of pads 2PD is arranged so as to spread out from the region CHR1 shown in FIG. 7 toward the region CHR2. In other words, each of the plurality of wirings 2d is arranged in each of the region CHR1 of the wiring layer WL2 shown in FIG. 10 and the region CHR2 of the wiring layer WL2 so as to straddle the side 3s1 of the semiconductor chip CHP1 in a perspective plan view seen from the wiring substrate SUB1 (see FIG. 10) from the semiconductor chip CHP1 side shown in FIG. 6. Since each of the plurality of wirings 2d is arranged so as to straddle the boundary line CBL1 between the region CHR1 and the region CHR2, a large number of signal transmission paths can be led out from the region CHR1 to the region CHR2.

When an increase in size of the semiconductor chip CHP1 is being suppressed and the number of terminals is increasing, layout of the plurality of electrodes 3PD of the semiconductor chip CHP1 shown in FIG. 6 needs to be made high density. Further, when an arrangement pitch of the electrode 3PD becomes small, a technique for reducing the arrangement pitch of the pad 2PD (see FIG. 7) on the wiring substrate SUB1 shown in FIG. 7 is required.

For example, in a case of the example shown in FIG. 7, a pitch P1 which is a center-to-center distance of the adjacent first-row pads 2PL1 is 150 to 200 μm. Further, each diameter of the plurality of pads 2PD shown in FIG. 8 has been set at 95 μm, and a diameter of the opening SRh has been set at 68 μm. Moreover, each diameter of the plurality of via-lands 2vL shown in FIG. 10 is, for example, 63 μm. Furthermore, each diameter of the plurality of via-wirings 2v shown in FIG. 8 is, for example, 25 μm. In addition, an example shown in FIG. 10 has been designed based on the following design rule: a wiring width is 11.7 μm and the shortest distance between adjacent conductor patterns is 12.0.

When the pitch P1 of the pad 2PD becomes small, it becomes difficult to arrange a signal wiring(s) between the adjacent pads 2PD. In arranging a large number of signal wirings connected to the pads 2PD, a plurality of signal wirings needs to be arranged between the adjacent via-lands 2vL among the plurality of via-lands 2vL (see FIG. 10) connected to the plurality of pads 2PDs. For example, in a case of an example of the present embodiment, as shown in FIG. 10, five wirings 2d are arranged between the adjacent first-row via-lands 2LL1.

As a method of coping with an increase in the number of lead-out wirings due to an increase in the number of terminals, there is a method of adopting a design rule that narrows a wiring width of the wiring 2d and a separation distance between the adjacent wirings 2d. However, only handling by the fineness of the wiring 2d or the like as described above brings limitations. Further, as another method for increasing the number of lead-out wirings, a method of forming the wiring 2d connected to the pad 2PD on a plurality of wiring layers can be considered. From the viewpoint of suppressing the increase in the number of wiring layers, it is preferable that the number of wiring layers in which the lead-out wiring is arranged is small.

Therefore, the inventor(s) of the present application has examined a method for increasing the number of wirings 2d which are lead-out wirings by a method other than the above, and found a structure of the present embodiment. That is, as shown in FIG. 10, the plurality of first-row via-lands 2LL1 has: a plurality of via-lands 2vL1 arranged so as to be shifted in a direction away from the boundary line CBL1 of the wiring layer WL2 from positions overlapping with the respective centers CPD (see FIG. 8) of the plurality of first-row pads 2PL1 (see FIG. 8); and a plurality of via-lands 2vL2 arranged at a position closer to the boundary line CBL1 of the wiring layer WL2 than the plurality of via-lands 2vL1. The plurality of via-lands 2vL1 and the plurality of via-lands 2vL2 are alternately arranged in the X direction along the boundary line CBL1 of the wiring layer WL2.

In other words, the plurality of first-row via-lands 2LL1 has a plurality of via-lands 2vL1 arranged such that their centers (see FIG. 8) are shifted in a direction away from the side 3s1 (see FIG. 6) of the semiconductor chip CHP1 (see FIG. 6) from a position overlapping with the center CPD (see FIG. 8) of the corresponding first-row pad 2PL1 (see FIG. 8) in a perspective plane view. Further, the plurality of first-row via-lands 2LL1 has a plurality of via-lands 2vL2 arranged at a position where their centers CVL2 are closer to the side 3s1 of the semiconductor chip CHP1 than the via-lands 2vL1 in the perspective plane view. In the perspective plane view, the plurality of via-lands 2vL1 and the plurality of via-lands 2vL2 are alternately arranged in the X direction along the side 3s1 of the semiconductor chip CHP1.

A configuration shown in FIG. 10 can be expressed as follows. The plurality of first-row via-lands 2LL1 includes via-lands 2vL1 and via-lands 2vL2 that are alternately arranged in the X direction along the boundary line CBL1 of the second wiring layer WL2, and a distance D1 from the via-land 2vL1 to the boundary line CBL1 of the wiring layer WL2 is longer than a distance D2 from the via-land 2vL2 to the boundary line CBL1 of the wiring layer WL2.

In a case of a structure of the present embodiment shown in FIG. 10, a separation distance between the via-land 2vL1 and via-land 2vL2 adjacent to each other can be made larger as compared with a case of linearly arranging the plurality of first-row via-lands 2LL1 along the X direction. Therefore, even if the design rule for narrowing the wiring width of the wiring 2d and the separation distance between the adjacent wirings 2d is not adopted, five wirings 2d can be arranged between the adjacent via-lands 2vL.

As a method of increasing the separation distance between the via-land 2vL1 and the via-land 2vL2, there is also a method of shifting the via-land 2vL1 so as to approach the boundary line CBL1 besides the method shown in FIG. 10. However, according to the study of the inventor of the present application, the inventor has found that the distance between the via-land 2vL and the boundary line CBL1 should not be too close from the viewpoint of suppressing fracture (breakage) of a joint interface between the via-land 2vL and the via-wiring 2v. As shown in FIG. 5, when the semiconductor chip CHP1 is mounted on the wiring substrate SUB1 by a flip-chip connecting method, a stress due to a temperature-cycle load or the like during use is generated around the pad 2PD. Specifically, due to a difference in the coefficient of linear expansion between the semiconductor chip CHP1 and the wiring substrate SUB1, the stress is generated in the plurality of pads 2PD connecting the semiconductor chip CHP1 and the wiring substrate SUB1. A stress distribution in a plan view indicates that as the pad 2PD is closer to a center of a front surface 3t (see FIG. 6) of the semiconductor chip CHP1, its stress becomes lower (weaker) and as the pad 2PD is closer to a peripheral portion of the front surface 3t, its stress becomes larger (stronger). When the strong stress is generated in the pad 2PD, the stress is transmitted (propagated) to an interior part of the wiring substrate SUB1 through the via-wiring 2v. Further, according to the study of the present inventor, the inventor has found that a stress concentration easily occurs at an interface between the via-wiring 2v and the via-land 2vL and, as a result, fracture is likely to occur at a joint interface between the via-wiring 2v and the via-land 2vL. Incidentally, in the study by the inventor of the present application, as the temperature cycle load, a temperature cycle load of −65° C. to 150° C. has been repeatedly applied 1500 times to the completed semiconductor device. Then, a state of the joint interface between the via-wiring 2v and the via-land 2vL has been photographed with an electron microscope, and presence or absence of the fracture has been evaluated.

From the above-mentioned findings, the inventor has understood that a position of the via-land 2vL1 is preferably not too close to the boundary line CBL1. As shown in FIG. 10, when being arranged so as to be shifted in the direction way from the boundary line CBL1 of the wiring layer WL2 from the position overlapping with each center of the plurality of first-row pads 2PL1 (see FIG. 8), each of the plurality of via-lands 2vL1 can increase the distance between the via-land 2vL1 and the boundary line CBL1, so that such an increase in distance is preferable from the viewpoint of suppressing the fracture of the joint interface between the via-land 2vL1 and the via wiring 2v.

Further, according to the study of the inventor of the present application, as shown in FIG. 9, the inventor has found that the center of the via-land 2vL1 preferably overlaps with no outline of the opening SRh of the insulating film SR1 from the viewpoint of suppressing the fracture of the joint interface between the via-wiring 2v and the via-land 2vL due to the above-mentioned stress. In FIG. 9, a virtual center line VCL in which the center of the via-land 2vL1 and the center of the via-wiring 2v extend in a Z direction is illustrated by a dash-double-dot line. Each center of the plurality of via-lands 2vL1 shown in FIG. 10 is arranged at a position that does not overlap with the outline of the opening SRh of the insulating film SR1 shown in FIG. 7. At a joint interface between the pad 2PD and the protrusion electrode 3BP, the above-mentioned stress becomes greatest on the outline of the opening SRh. Therefore, like the present embodiment, the center of the via-land 2vL1 is arranged at the position that does not overlap with the outline of the opening SRh of the insulating film SR1, which makes it possible to suppress the fracture of the joint interface between the via-wiring 2v and the via-land 2vL1.

A structure shown in FIG. 9 can be described as follows by focusing on the via-wiring 2v. The center of the via-wiring 2v connected to the via-land 2vL1 is arranged at the position that does not overlap with the outline of the opening SRh of the insulating film SR1. The center of the via-wiring 2v connected to each of the plurality of via-lands 2vL1s shown in FIG. 10 is arranged at a position that does not overlap with the outline of the opening SRh of the insulating film SR1 shown in FIG. 7. This makes it possible to suppress the fracture of the joint interface between the via-wiring 2v and the via-land 2vL1.

From the viewpoint of improving a joint strength between the via-wiring 2v and the via-land 2vL, it is preferable that the center of the via-wiring 2v and the center of the via-land 2vL overlap with each other as shown in FIG. 9. However, even if the center of the via-wiring 2v and the center of the via-land 2vL are designed to overlap with each other in the design, the center of the via-wiring 2v and the center of the via-land 2vL may deviate from each other depending on a manufacturing condition such as processing accuracy. If the center of the via-wiring 2v and the center of the via-land 2vL are designed to overlap with each other, a degree of deviation can be reduced even if a central position deviates due to the processing accuracy.

Further, as shown in FIG. 8, the central CVL2 of the via-land 2vL2 (see FIG. 10) overlaps with the central CPD of the first-row pad 2PPL1. Furthermore, the central CV2 of the via-wiring 2v connected to the via-and 2vL2 overlaps with the central CPD of the first-row pad 2PL1. Similarly, centers CVL3 of the plurality of second-row via-lands 2LL2 (see FIG. 10) overlap with centers CPD of the plurality of second-row pads 2PL2. The center CV3 of the via-wiring 2v connected to the plurality of second-row via-lands 2LL2 overlaps with the centers CPD of the plurality of second-row pads 2PL2. Moreover, centers CVL4 of the plurality of third-row via-lands 2LL3 (see FIG. 10) overlap with centers CPD of the plurality of third-row pads 2PL3. A center CV4 of the via-wiring 2v connected to the plurality of third-row via-lands 2LL3 overlaps with the centers CPD of the plurality of third-row pads 2PL3 shown in FIG. 7. In this way, when shifting the positions of the via-land 2vL and the via-wiring 2v is not required, it is preferable that the center of the pad 2PD, the center of the via-wiring 2v, and the center of the via-land 2vL are arranged so as to overlap with one another.

Although some modification examples have been described in the above-described embodiment, a typical modification example other than the modification examples described in the above-described embodiment will be described below.

First Modification Example

Figure 11:
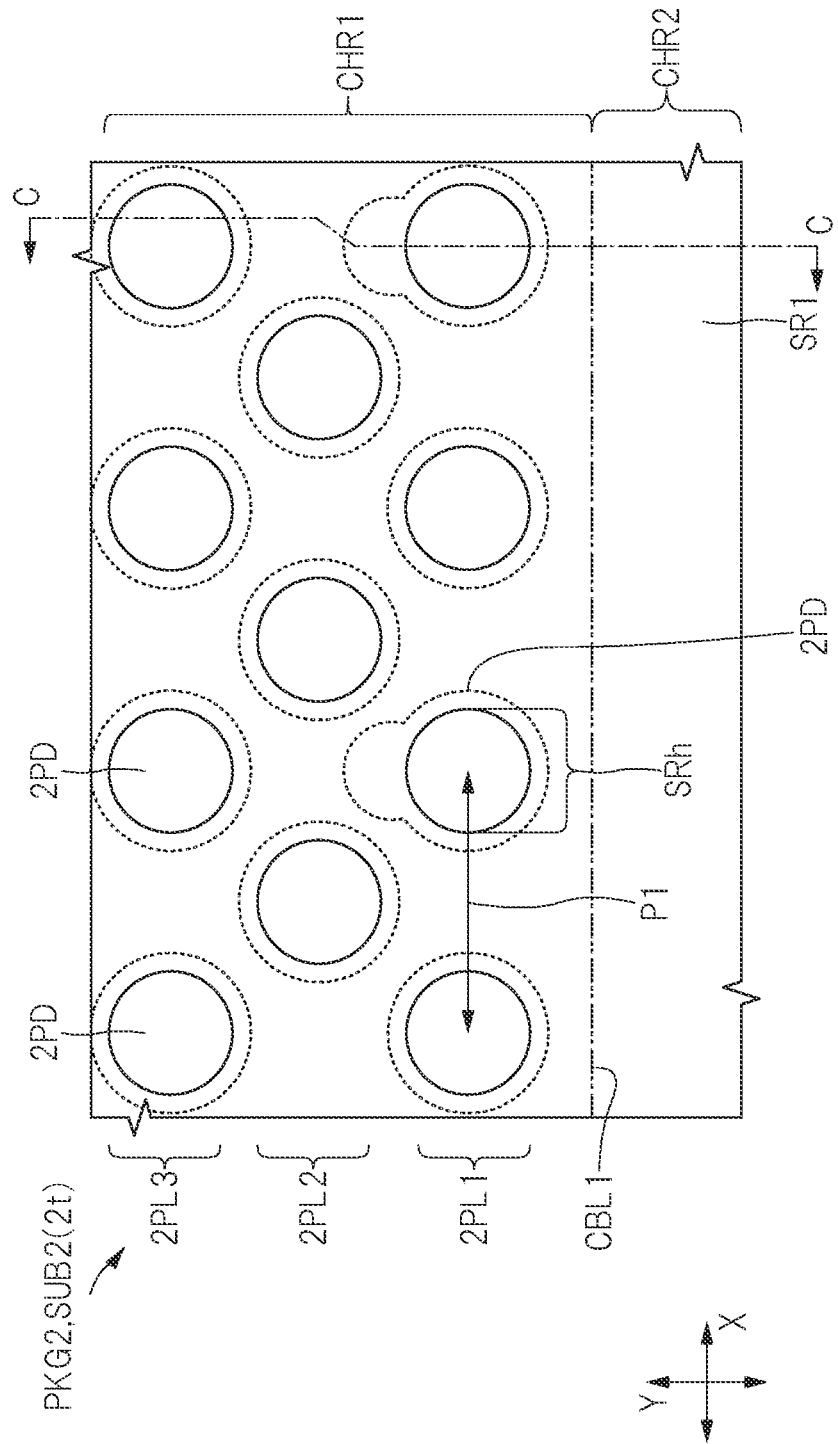
FIG. 11 is an enlarged plan view of a wiring substrate that is a modification example related to the wiring substrate shown in FIG. 7.
Figure 12:
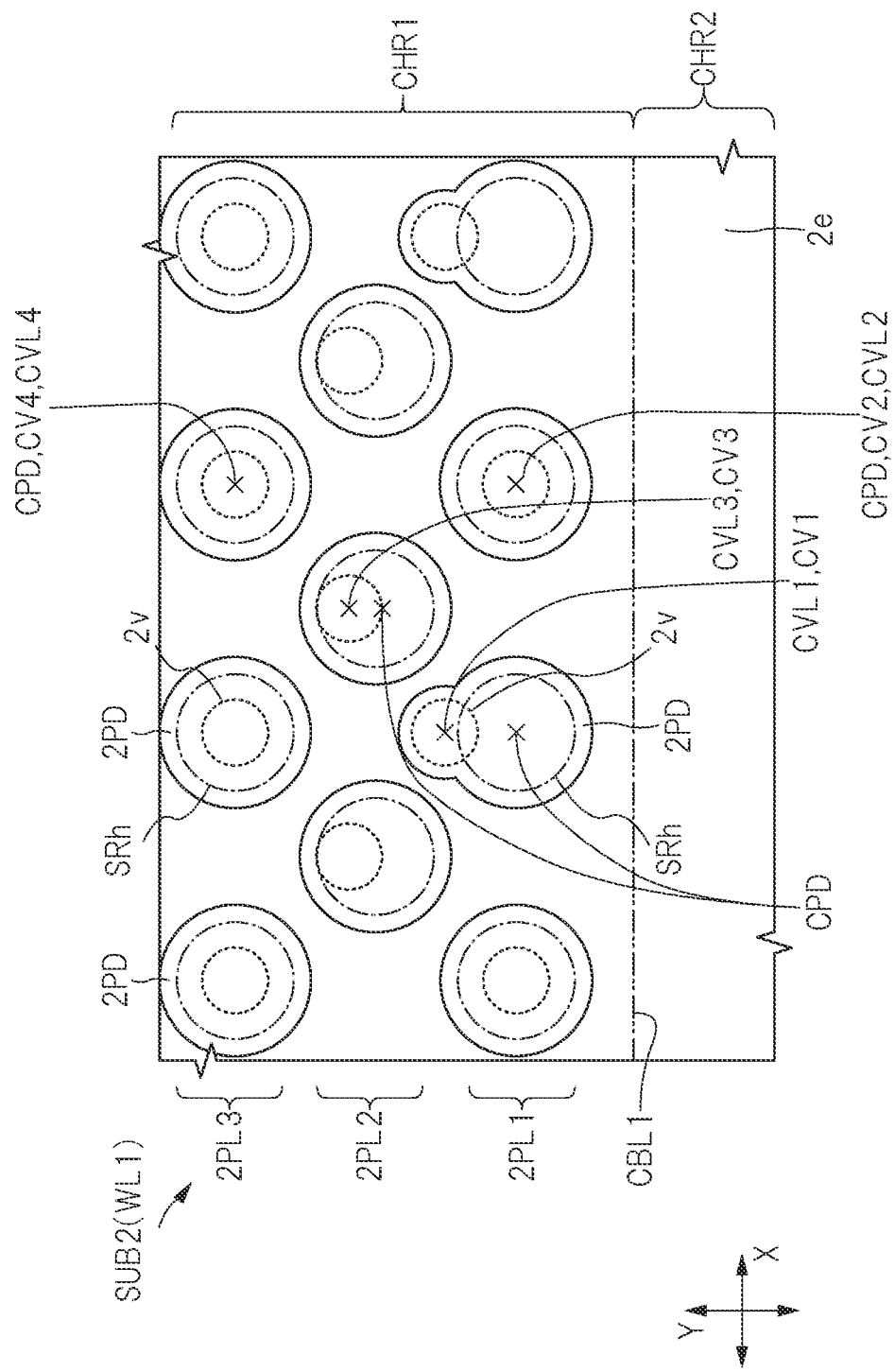
FIG. 12 is an enlarged plan view showing, in a plan shown in FIG. 11, a state of removing the insulating film that covers the wiring layer.
Figure 13:
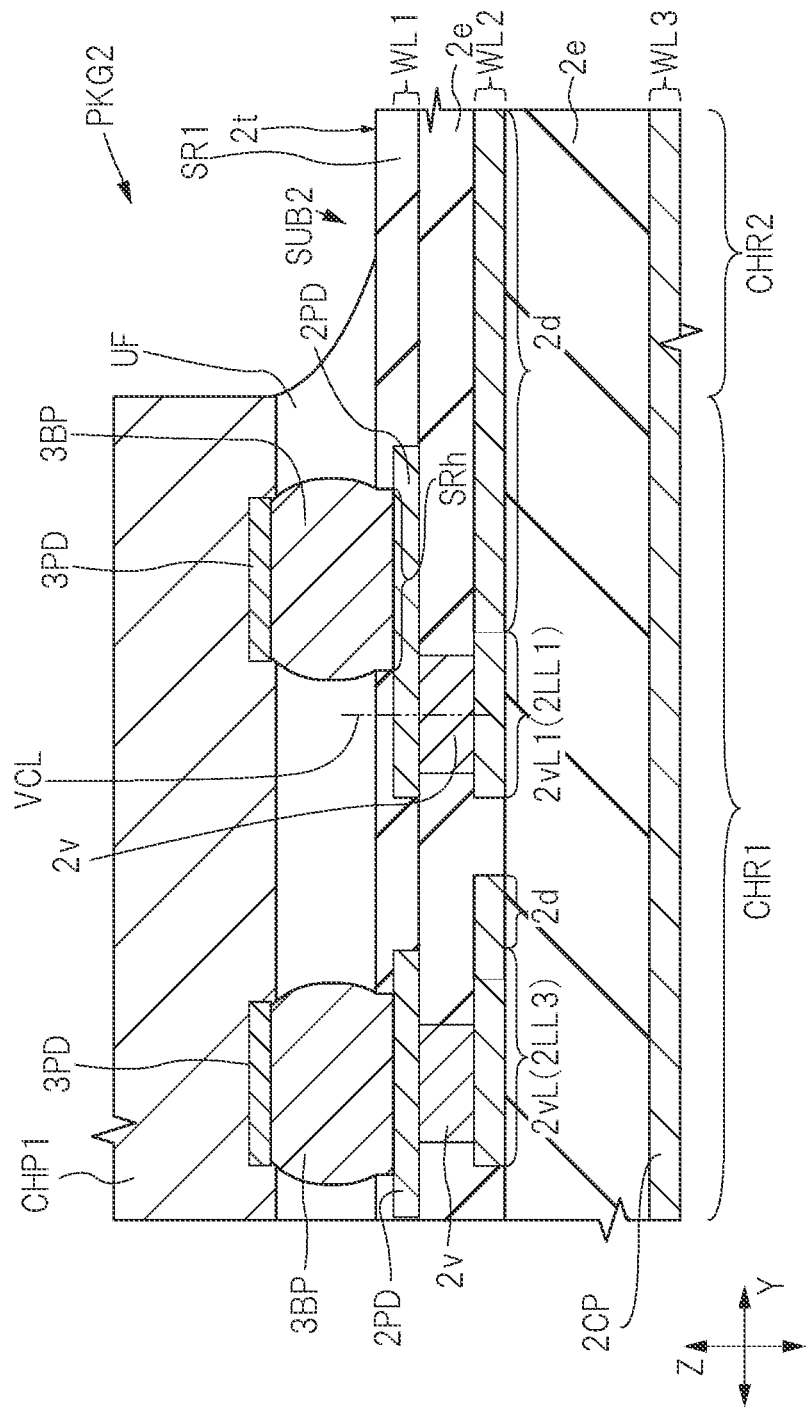
FIG. 13 is an enlarged plan view taken along line C-C of FIG. 11.
Figure 14:
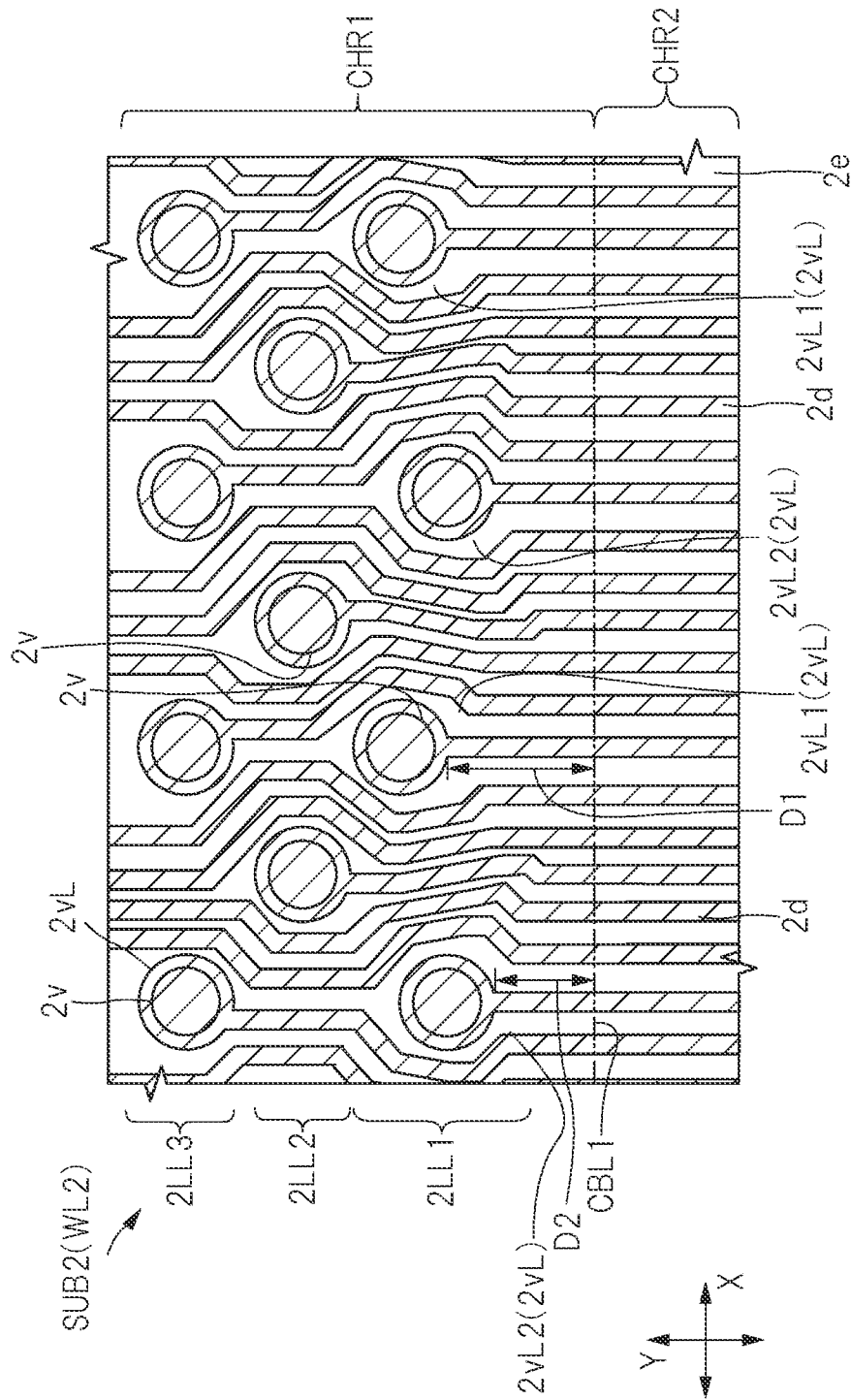
FIG. 14 is an enlarged plan view showing second wiring layer of a wiring substrate that is a modification example of FIG. 10, and shows a portion overlapping with a portion shown in FIG. 11.

FIG. 11 is an enlarged plan view of a wiring substrate which is a modification example of the wiring substrate shown in FIG. 7. In FIG. 11, an outline of an outer periphery of the pad 2PD is shown by a dotted line similarly to that of FIG. 7. FIG. 12 is an enlarged plan view showing a state in which an insulating film covering a wiring layer is removed in the plan shown in FIG. 11. In FIG. 12, an outline of the via-wiring 2v is illustrated by a dotted line, and an outline of the opening SRh shown in FIG. 11 is illustrated by a dash-single-dot line. FIG. 13 is an enlarged sectional view taken along line C-C of FIG. 7. FIG. 14 is an enlarged plan view showing a second wiring layer of the wiring substrate, which is a modification example of FIG. 10, and shows a portion overlapping with a portion shown in FIG. 11. In FIG. 14, in order to make it easy to differentiate between a portion forming a conductor pattern and the other portion, hatching is attached to each of the plurality of wirings 2d, the plurality of via-lands 2vL, and the plurality of via-wirings 2v. In FIG. 12, each position of a center CPD of the pad 2PD, a center CVL1 of the via-land 2vL1 (see FIG. 10), a center CV1 of the via-wiring 2v connected to the via-land 2vL1, a center CVL2 of the via-land 2vL2 (see FIG. 10), and a center CV2 of the via-wring 2v connected to the via-land 2vL2 is marked and illustrated. Similarly, as shown in FIG. 8, each position of a center CPD of the second-row pad 2PD, a center CVL3 of the second-row via-land 2LL2 (seen FIG. 14), a center CV3 of the via-wiring 2v connected to the second-row via-land 2LL2, a center CVL4 of the third-row via-land 2LL3 (see FIG. 14), and a center of CV4 of the via-wiring 2v connected to the third-row via-land 2LL3 is marked and illustrated.

A wiring substrate SUB2, which the semiconductor device PKG2 (see FIGS. 11 and 13) shown in FIGS. 11 to 14 has, is different from the wiring substrate SUB1 shown in FIGS. 7 to 10 in the following points. As can be seen by comparing FIG. 12 and FIG. 14, each center CVL3 (see FIG. 12) of the plurality of second-row via-lands 2LL2 (see FIG. 14) is arranged so as to be shifted in a direction away from the boundary line CBL1 of the wiring layer WL2 from a position that overlaps with each center CPD (see FIG. 12) of the plurality of second-row pads 2PL2 (see FIG. 12).

A structure of the wiring substrate SUB2 shown in FIGS. 11 to 14 can be described as follows. A separation distance between each center CVL3 (see FIG. 12) of the plurality of second-row via-lands 2LL2 and the boundary line CBL1 of the wiring layer WL2 (in other words, the side 3s1 of the semiconductor chip CHP1 shown in FIG. 6 in a perspective plan view) is longer than a separation distance between each center CPD of the plurality of second-row pads 2PL2 (see FIG. 8 or FIG. 12) and the boundary line CBL1 (in other words, the side 3s1 of the semiconductor chip CHP1 shown in FIG. 6 in a perspective plan view) of the wiring layer WL1 (see FIG. 12).

As shown in FIG. 14, the plurality of second-row via-lands 2LL2 connected to the plurality of second-row pads PL2 is shifted in the direction away from the boundary line CBL1, so that a distance between each of the plurality of second-row via-lands 2LL2 and each of the plurality of via-lands 2vL1 can be increased (widened) as compared with that of an example shown in FIG. 10. In a case of this modification example, as can be seen by comparing FIGS. 14 and 10, a distance D1 from the via-land 2vL1 to the boundary line CBL1 of the wiring layer WL2 can be made longer than that of the wiring substrate SUB1 shown in FIG. 10. As a result, the separation distance between the via-land 2vL1 and the via-land 2vL2 adjacent to each other can be further increased, so that a margin can be given to the design rule of the plurality of wirings 2d arranged in the wiring layer WL2.

For example, as shown in FIG. 13, the center CVL1 (see FIG. 12) of the via-land 2vL1 is arranged outside the opening SRh of the insulating film SR1. Each center CVL1 of the plurality of via-wirings 2vL1 shown in FIG. 14 is arranged outside the insulating film STh. Further, as shown in FIGS. 12 and 13, the center CV1 of the via-wiring 2v connected to each via-land 2vL1 is arranged outside an outline of the opening SRh of the insulating film SR1.

As described above, when the via-wiring 2v and the center CVL1 of the via-land 2vL1 are arranged outside the joint interface between the pad 2PD and the protrusion electrode 3BP (see FIG. 13) in the perspective plan view, it is easily suppressed that the above-mentioned stress is transmitted to the joint interface between the via-wiring 2v and the via-land 2vL1. Therefore, according to this modification example, the fracture at the joint interface between the via-wiring 2v and the via-land 2vL1 can be further suppressed.

Second Modification Example

Further, although the examples of the design rules are shown for the examples shown in FIGS. 7 to 10, values of the design rules are not limited to the above-mentioned values and various modification examples can be applied. For example, given is a modification example, in which a diameter of the via-wiring 2v is expanded to 40 μm, among the above-mentioned numerical examples. In this case, since a junction area between the via-wiring 2v and the via-land 2vL is increased, a joint strength can be improved. Further, for example, given is a modification example, in which a diameter of the via-and 2vL is set to 53 μm, among the above-mentioned numerical examples. In this case, since the separation distance between the adjacent via-lands 2vL can be increased, the design rules relating to the wiring width and the separation distance of the conductor pattern can be relaxed.

Third Modification Example

Further, each of the plurality of pads 2PD shown in FIGS. 7, 8, 11, and 12 is, for example, a pad for signal transmission through which an electric signal is transmitted. However, included between the plurality of signal transmission paths may be the supply path of the reference potential VSS shown in FIG. 2, for example, as a transmission path for return current or for electromagnetic wave shielding of the signal transmission path.

Fourth Modification Example

Further, for example, although various modification examples have been described as mentioned above, each modification example mentioned above can be combined and applied.

Although the invention made by the present inventor has been specifically described above based on the embodiments, the present invention is not limited to the above-mentioned embodiments and, needless to say, can be variously modified without departing from the scope thereof.

What is claimed is:
1. A semiconductor device comprising:
a semiconductor chip having a first surface and a plurality of electrode terminals arranged on the first surface; and
a wiring substrate on which the semiconductor chip is mounted,
wherein the wiring substrate includes:
a first wiring layer having a plurality of pads connected to the plurality of electrode terminals, respectively;
a second wiring layer having a plurality of wirings electrically connected to the plurality of pads, respectively, and a plurality of via-lands connected to the plurality of wirings, respectively; and
a plurality of via-wirings electrically connecting the plurality of pads on the first wiring layer with the plurality of via-lands on the second wiring layer, respectively, wherein, in a perspective plan view seeing the wiring substrate from the semiconductor chip, each of the first wiring layer and the second wiring layer includes:
a first region overlapping with the semiconductor chip; and
a second region not overlapping with the semiconductor chip,
wherein each of the plurality of pads is arranged in the first region of the first wiring layer,
wherein each of the plurality of wirings is arranged in each of the first region on the second wiring layer and the second region on the second wiring layer such that each of the plurality of wirings straddles a first side of the semiconductor chip in the perspective plan view,
wherein the plurality of pads includes:
a plurality of first-row pads arranged along the first side of the semiconductor chip in the perspective plan view and arranged at a position closest to the first side; and
a plurality of second-row pads arranged along the first side of the semiconductor chip in the perspective plan view and arranged at a position second closest to the first side,
wherein the plurality of via-lands includes:
a plurality of first-row via-lands connected to the plurality of first-row pads, respectively; and
a plurality of second-row via-lands connected to the plurality of second-row pads, respectively,
a plurality of first via-lands arranged such that a center of each of the plurality of first via-lands is shifted in a direction away from the first side of the semiconductor chip than a position overlapping with a center of the corresponding first-row pad in the perspective plan view, and
a plurality of second via-lands arranged such that a center of each of the plurality of second via-lands is arranged at a position closer to the first side of the semiconductor chip than the first via-land in the perspective plan view, and
wherein, in the perspective plan view, the plurality of first via-lands and the plurality of second via-lands are alternately arranged in a first direction along the first side of the semiconductor chip.

2. The semiconductor device according to claim 1, wherein each center of the plurality of second-row via-lands is arranged such that each center of the plurality of second-row via-lands is shifted in a direction away from the first side of the semiconductor chip from a position overlapping with each center of the plurality of second-row pads in the perspective plan view.

3. The semiconductor device according to claim 1, wherein each peripheral portion of the plurality of pads is covered with a first insulating film, and each central portion of the plurality of pads is exposed from the first insulating film in an opening formed in the first insulating film, and
wherein each center of the plurality of first via-lands is arranged at a position not overlapping with an outlie of the opening in the first insulating film.

4. The semiconductor device according to claim 3, wherein each center of the plurality of first via-lands is arranged outside an outline of the opening in the first insulating film, and
wherein each of the plurality of second-row via-lands is arranged such that each of the plurality of second-row via-lands is shifted in a direction away from the first side of the semiconductor chip from a position overlapping with each center of the plurality of second-row pads in the perspective plan view.

5. The semiconductor device according to claim 1, wherein each peripheral portion of the plurality of pads is covered with a first insulating film, and each central portion of the plurality of pads is exposed from the first insulating film in an opening formed in the first insulating film, and
wherein a center of a via-wiring connected to each of the plurality of first via-lands is arranged in a position not overlapping with an outline of the opening in the first insulating film.

6. The semiconductor device according to claim 5, wherein a center of the via-wiring connected to each of the plurality of first via-lands is arranged outside the outline of the opening in the first insulating film, and
wherein each of the plurality of second-row via-lands is arranged such that each of the plurality of second-row via-lands is shifted in a direction away from the first side of the semiconductor chip from a position overlapping with each center of the plurality of second-row pads in the perspective plan view.

7. The semiconductor device according to claim 1, wherein each of the plurality of second-row pads is arranged such that each of the plurality of second-row pads is located between the plurality of first-row pads in the first direction.

8. The semiconductor device according to claim 1, wherein centers of the plurality of second via-lands overlap with centers of the plurality of first-row pads.

9. A semiconductor device comprising:
a semiconductor chip having a first surface and a plurality of electrode terminals arranged on the first surface; and
a wiring substrate on which the semiconductor chip is mounted,
wherein the wiring substrate has:
a first wiring layer on which a plurality of pads connected to the plurality of electrode terminals is arranged;
a second wiring layer on which a plurality of wirings electrically connected to the plurality of pads and a plurality of via-lands connecting respective parts of the plurality of wirings are arranged; and
a plurality of via-wirings to which the plurality of pads of the first wiring layer and the plurality of via-lands of the second wiring layer are electrically connected,
wherein, in a perspective plan view seeing the wiring substrate from the semiconductor chip, each of the first wiring layer and the second wiring layer on the wiring substrate includes:
a first region overlapping with the semiconductor chip;
a second region not overlapping with the semiconductor chip;
a first boundary line serving as a boundary between the first region and the second region and overlapping with the semiconductor chip,
wherein each of the plurality of pads is arranged in the first region of the first wiring layer,
wherein each of the plurality of wirings is arranged such that each of the plurality of wirings straddles the first side of the semiconductor chip in the perspective plan view,
wherein the plurality of pads includes:
a plurality of first-row pads arranged along the first boundary line in the perspective plan view and arranged at a position closest to the first boundary line; and a plurality of second-row pads arranged along the first boundary line in the perspective plan view and arranged at a position second closest to the first boundary line, wherein the plurality of via-lands include:
a plurality of first-row via-lands connected to the plurality of first-row pads; and
a plurality of second-row via-lands connected to the plurality of second-row pads, wherein the plurality of first-row via-lands includes a first via-land and a second via-land alternately arranged in a first direction along the first side of the semiconductor chip in the perspective plan view, and wherein a distance from the first via-land to the first side of the semiconductor chip in the perspective plan view is longer than a distance from the second via-land to the first side of the semiconductor chip in the perspective plan view.

10. The semiconductor device according to claim 9,
wherein a separation distance between each center of the plurality of second-row via-lands and the first side of the semiconductor chip in the perspective plan view is longer than a separation distance between each center of the plurality of second-row pads and the first boundary line on the first wiring layer.

11. The semiconductor device according to claim 9,
wherein each peripheral portion of the plurality of pads is covered with a first insulating film, and each central portion of the plurality of pads is exposed from an opening formed in the first insulating film, and
wherein each center of the plurality of first via-lands is arranged at a position not overlapping with an outline of the opening in the first insulating film.

12. The semiconductor device according to claim 9,
wherein each peripheral portion of the plurality of pads is covered with a first insulating film, and each central portion of the plurality of pads is exposed from the first insulating film in an opening formed in the first insulating film, and
wherein a center of a via-wiring connected to each of the plurality of second via-lands is arranged at a position not overlapping with an outline of the opening in the first insulating film.

* * * * *